United States Patent [19]
Tanaka et al.

[11] Patent Number: 5,974,069
[45] Date of Patent: Oct. 26, 1999

[54] SEMICONDUCTOR LASER AND MANUFACTURING METHOD THEREOF

[75] Inventors: Haruo Tanaka; Yukio Shakuda, both of Kyoto, Japan

[73] Assignee: Rohm Co., Ltd, Kyoto, Japan

[21] Appl. No.: 08/892,273

[22] Filed: Jul. 14, 1997

Related U.S. Application Data

[62] Division of application No. 08/529,053, Sep. 15, 1995, abandoned.

[30] Foreign Application Priority Data

| Sep. 16, 1994 | [JP] | Japan | 6-222020 |
| Sep. 28, 1994 | [JP] | Japan | 6-233177 |
| Sep. 28, 1994 | [JP] | Japan | 6-233178 |
| Sep. 29, 1994 | [JP] | Japan | 6-235011 |
| Sep. 29, 1994 | [JP] | Japan | 6-235012 |

[51] Int. Cl.$^6$ .................................................. H01S 3/19
[52] U.S. Cl. ................................................ 372/46; 372/45
[58] Field of Search ............................................. 372/46, 45

[56] References Cited

U.S. PATENT DOCUMENTS

| 4,567,060 | 1/1986 | Hayakawa et al. . | |
| 4,890,293 | 12/1989 | Taneya et al. . | |
| 5,042,043 | 8/1991 | Hatano et al. . | |
| 5,210,767 | 5/1993 | Arimoto et al. . | |
| 5,218,613 | 6/1993 | Serreze . | |
| 5,235,609 | 8/1993 | Uchida et al. . | |
| 5,268,328 | 12/1993 | Mori et al. | 372/45 |
| 5,386,429 | 1/1995 | Naito et al. . | |
| 5,395,792 | 3/1995 | Ikawa et al. . | |
| 5,432,808 | 7/1995 | Hatano et al. | 372/45 |
| 5,436,923 | 7/1995 | Nagai | 372/45 |
| 5,488,233 | 1/1996 | Ishikawa et al. | 372/45 |
| 5,583,881 | 12/1996 | Uchida et al. . | |

FOREIGN PATENT DOCUMENTS 0 477 013 A2  3/1992  European Pat. Off. .

OTHER PUBLICATIONS

Abstract of Japanese Patent, Publ. No. 02–129915, dated May 7, 1992.

*Primary Examiner*—Rodney Bovernick
*Assistant Examiner*—Quyen Phan Leung
*Attorney, Agent, or Firm*—Nikaido Marmelstein Murray & Oram LLP

[57] ABSTRACT

In a semiconductor laser which uses a semiconductor of GaN type compound, an optimum material is used for a current blocking layer, so that it is made possible to obtain a semiconductor laser that satisfies a gain guiding structure of high light emitting efficiency or a refractive index guiding structure or both, thereby facilitating control of the noise of oscillated light (reduction of noise), control of the spread of light in lateral direction, and control of the longitudinal mode.

5 Claims, 18 Drawing Sheets

SEMICONDUCTOR LASER AND MANUFACTURING METHOD THEREOF

This is a divisional, of application Ser. No. 08/529,053 filed Sep. 15, 1995 now abandoned.

BACKGROUND OF THE INVENTION

The invention relates to a semiconductor light emitting device such as a semiconductor laser. More particularly, the present invention relates to a semiconductor light emitting device which consists of a semiconductor of gallium nitride type compound and is suitable for emitting blue light.

The semiconductor of gallium nitride (GaN) type compound described here is referred to as a semiconductor comprising a GaN compound which consists of Ga of group III element and N of group V element, or III–V compound in which part of Ga of GaN is substituted by other group III element such as Al or In and/or part of N of GaN is substituted by other group V element such as P or As.

In the past, there has been extensively spread the technology for manufacturing a semiconductor laser which emits infrared rays or red rays using GaAs. In contrast, there has been desired a semiconductor laser which emits in a visible ray area blue ray of shorter wave length than that of the foregoing semiconductor laser, by using a semiconductor of GaN type compound, it has become possible to manufacture a light emitting diode (hereinafter referred to as LED) which emits blue light, while the development of a semiconductor laser which emits blue light is under way. In an LED which uses the semiconductor of gallium nitride type compound, during epitaxial growth of a p-type layer, comprising Ga and N, since a p-type dopant Mg or Zn is easily coupled with H atoms in the carrier gas such as $H_2$ or the reactant gas such as $NH_3$ and the p-type dopant does not fully fulfill the functions thereof, the grown p-type layer is activated by annealing in order to reduce the resistance by separating the coupling with Mg or Zn and H.

On the other hand, in such a semiconductor laser as this which uses a semiconductor of GaN type compound, it is difficult to manufacture such a semiconductor laser which corresponds to a GaAs type compound semiconductor laser of refractive index guiding structure which contain both the light absorption layer and the current blocking layer. In other words, in order to make the current blocking layer as the absorption layer, the band gap energy of the current blocking layer must be made to be equal or smaller than that of the active layer, therefore, if a semiconductor of InGaN type compound is used for the active layer, a semiconductor material having large composition ratio of In must be used for the current blocking layer. However, when the composition ratio of In increases, the atom of In easily evaporates at the normal growth temperature, and it is difficult to deposit a film of compound semiconductor, while controlling the composition ratio.

Generally, as a wave guide structure of a semiconductor laser, a refractive index guiding structure and a gain guiding structure are known. The refractive index guiding structure is provided with a difference of refractive index in parallel direction with respect to the active layer so as to confine and direct the light, and thus it is possible to obtain a single lateral mode oscillation up to a high output operation, but the coherence possibility is high and the noise induced by the return light (optical feedback noise) is apt to generate. On the other hand, the gain guiding structure is one which does not have a difference of refractive index in lateral direction, in which the lateral mode is unstable and kink is apt to occur, but the optical feedback noise is low because the longitudinal multiple mode is oscillated.

As a structure of a semiconductor laser suitable for the gain guiding structure which uses a semiconductor of GaN type compound, one shown in FIG. 16 or FIG. 17 can be considered. To describe the one shown in FIG. 16, on a sapphire substrate 1 are laminated in order a buffer layer 2 consisting of GaN, a lower cladding layer 3 consisting of $Al_zGa_{1-z}N$ (0<z<1), an active layer 4 consisting of $In_xGa_{1-x}N$ (0<x<1), an upper cladding layer 5 consisting of $Al_zGa_{1-z}N$, and a contact layer 8, and further an upper electrode 9 in the form of a stripe is provided thereon. Further, part of the layers laminated are removed until part of the lower cladding layer 3 or the buffer layer 2 is exposed, and a lower electrode 10 is provided on the exposed surface. In this case, when voltage is applied between the upper and lower electrodes 9 and 10, electric current flows only to part of the central portion in the active layer 4 according to the shape of the upper electrode 9 so as to make such part into an active area where laser light is generated. However, in a semiconductor laser of such a structure as this, it becomes difficult to control the electric current to be injected into the active area.

With respect to FIG. 17 in which portions corresponding to the same portions shown in FIG. 16 are provided with the same numerals, for the purpose of leaving the upper electrode 9 and the semiconductor layers thereunder in the form of a stripe, the portion of both sides thereof is etched and removed from the top halfway down the upper cladding layer 5, and made into a mesa-type shape. In accordance with such structure as this, the control of the electric current to be injected becomes easy as compared to the structure shown in FIG. 16, but the control of dimensions in manufacturing is difficult, the side wall of the stripe-like portion to be removed and exposed by etching is susceptible to damage by the etching, and a semiconductor laser with good quality cannot be obtained.

On the other hand, an example of a conventional semiconductor laser of the refractive index guiding structure which uses a semiconductor of GaAs type compound is shown in FIG. 18. In FIG. 18, the numeral 21 represents a semiconductor substrate consisting, for example, of an n-type GaAs or the like, on which are laminated in order a lower cladding layer 22 consisting, for example, of an n-type $Al_vGa_{1-v}As$ (0.35≦v≦0.75), an active layer 23 consisting, for example, of a non-doping type or n-type or p-type $Al_wGa_{1-w}As$ (0<w<0.7, w<v) a first upper cladding layer 24 consisting of a p-type $Al_vGa_{1-v}As$, a current blocking layer 25 consisting of an n-type GaAs, a second upper cladding layer 26 consisting of a p-type $Al_vGa_{1-v}As$, and a contact layer 27 consisting of a p-type GaAs, on the top surface and the bottom surface are respectively provided a p-side electrode 28 and an n-side electrode 29, and a chip of a semiconductor laser is formed. In this structure, the current blocking layer 25 consisting of the n-type GaAs is a conductive type layer which is different from the p-type cladding layer in the neighborhood, wherein the gap energy of a pn junction is utilized to block electric current, injection current is restricted to the stripe-like active area of width W, and by absorbing the light generated in the active layer (that is, as a light absorption layer), a difference of refractive index is provided inside and outside of the stripe. Therefore, the light is confined in the lateral direction, and is used as a semiconductor laser of refractive index guiding structure of red ray or infrared ray which stably directs the wave in a stripe-like width W of the active layer 23a.

In this structure, by using a material which does not absorb the light as the current blocking layer 25, and by keeping away the current blocking layer 25 from the active layer 23 at the distance, a semiconductor laser of gain guiding structure can be obtained, but in a semiconductor laser which uses a semiconductor of GaN type compound in particular, when GaN is used as the current blocking layer 25 and the distance from the active layer is kept away to obtain the gain guiding structure, leakage current increases, so that a suitable material as the current blocking layer 25 is desired.

Further, an example of a semiconductor laser of the gain guiding structure which uses a semiconductor of a conventional GaAs type compound is shown in FIG. 19. In this structure, a high resistance layer 30 is formed by implanting the protons and the like on both sides of the current injection area, and the current injection area is controlled in the same manner as the construction shown in FIG. 16 through FIG. 17 and is made a gain guiding structure. The portions which are the same as those shown in FIG. 18 are designated with the same symbols and the description thereof is omitted.

The band gap energy and the refractive index of the semiconductor of GaN type compound are different from those of the semiconductor of GaAs type compound respectively, and therefore, it is not possible to obtain a semiconductor laser which uses a semiconductor of GaN type compound having the same structure as that of a semiconductor laser which uses a semiconductor of GaAs type compound. In a semiconductor laser of the structure shown in the foregoing FIG. 16, it is necessary to provide a large distance between the electrode 9 and the active layer 4, and because it is not possible to excessively increase the carrier density of a p-type layer of the semiconductor of GaN type compound and thus the electric current is difficult to flow, power consumption becomes large and the light emitting efficiency is lowered. In the structure shown in FIG. 17, etching must be provided to obtain a mesa-type shape, but it is difficult to etch the semiconductor of GaN type compound as compared with that of GaAs type compound, and when providing the wet etching, the semiconductor must be etched for about 1 to about 60 minutes at high temperature of more than 150 to 250° C., it takes longer time for etching at low temperature, while the control of etching at high temperature is difficult. In the case of dry etching, there is a problem in that reactive ion etching must be performed under the atmosphere of chlorine gas, so the etched surface is damaged and attachment of contamination occurs during etching.

In order to provide a current blocking layer comprised of a material which does not absorb light, there is a problem, as described above, in that the leakage of light is large even if GaN is used and the light emitting efficiency is lowered, and the material suitable for the current blocking layer is not obtained.

In order to provide a current blocking layer comprised of a material capable of absorbing light (light absorption material), there is a problem, as described above, in that it is difficult to deposit a film of light absorption material consisted of a semiconductor of GaN type compound, and a semiconductor laser of complex refractive index guiding structure cannot be obtained.

On the other hand, in order to obtain a semiconductor laser of stable oscillation with low optical feedback noise and high kink level, it is preferable to employ the strong point of both types of the foregoing refractive index guiding structure and the gain guiding structure, but the current blocking layer made from a suitable material capable of absorbing light has not been obtained.

Further, as described above, in a semiconductor laser of the structure shown in FIG. 18, when much light of the active layer 23 is caused to be absorbed by the current blocking layer 25, such structure will be a refractive index guiding structure which is apt to perform single longitudinal mode oscillation with high coherence possibility. Therefore, the optical feedback noise is easily generated. On the other hand, when the light of the active layer is not caused to be absorbed by the current blocking layer, a gain guiding type structure which does not have a difference of refractive index in lateral direction is obtained, but in the semiconductor laser of gain guiding structure, the optical feedback noise becomes small while the astigmatic difference becomes large, and further the lateral mode is not stable, and kink is apt to occur easily. The nature of both the refractive index guiding structure and the gain guiding structure differ delicately depending not only on the material of the current blocking layer but also on the conditions such as the distance between the active layer 23 and the current blocking layer 25, that is, the thickness of the first upper cladding layer, and the width of the stripe-like current injection area formed in the current blocking layer 25, so that there occurs a complicated correlation in conjunction with the absorption characteristic involved in the material of the current blocking layer 25. So there is a problem in that a semiconductor laser restricting noise generation and having the desired high characteristic cannot be obtained.

In a conventional semiconductor laser of electrode stripe-like structure, there is a problem in that when the distance between the active layer and the electrode increases, the leakage current which diffuses in outer of the width of the electrode stripe and does not contribute to the emission of light increases, and especially because the operating voltage is about 3 V in a semiconductor laser of gallium nitride type compound, if the leakage current increases, the waste of electric power which does not contribute to the emission of light increases and it causes the light emitting efficiency to lower.

In accordance with a method whereby the proton or the like is implanted into the non-current injection area to provide high resistance on both sides of the electrode stripe, there is a problem in that an ion implanter will become a large-scale apparatus and it is not suitable for mass production in which a low cost is required.

Further, in accordance with a method whereby part of semiconductor layers are etched and made into a mesa-type shape, there is a problem in that it takes time for etching and especially it is difficult to etch semiconductor layers of gallium nitride type compound, either the wet etching must be performed at high temperature of more than 250° C. or the reactive ion etching must be performed under the atmosphere of chlorine gas, involving hard works.

In each of the foregoing conventional semiconductor laser, all the both end faces where the stripe-like active area 23a is exposed are vertical with respect to the direction of laminating these semiconductor layers, and optical resonator is formed between the both end faces but the end faces absorb the light, and in turn deterioration due to temperature rise cannot be avoided in such a structure.

Further, because a cleavage is performed in manufacturing, so the length of the resonator is restricted, that is, there has been manufactured only a semiconductor laser having resonator of more than 200 μm. From the standpoint of the required intensity of the laser ray to be generated, it is possible to manufacture a semiconductor laser even if the length of a resonator is less than 100 μm, but a semiconductor laser having such a resonator has not been manufactured yet.

In addition, in such a semiconductor light emitting device as a conventional semiconductor laser or an LED wherein the light emitting layer (active layer) is provided between the cladding layers, and the light is emitted from the end face in parallel to semiconductor layers laminated. So if it is required to emit the light in a vertical direction to a surface of a semiconductor chip (semiconductor layers laminated) which is mounted on a submount or a lead frame, it is necessary to provide newly a reflection surface 20, as shown in FIG. 20 for example, on the outside of the end face of a semiconductor layer 11 so as to direct a light path 13 into vertical direction to a surface of a semiconductor chip.

SUMMARY OF THE INVENTION

A first object of the present invention is to provide, in a semiconductor laser which uses a semiconductor of GaN type compound, a semiconductor laser having a current blocking layer, the material of which does not absorb the light and has less leakage. In such a semiconductor laser, it is possible to obtain a gain guiding structure of high light emitting efficiency and to easily control the noise of oscillated light (for noise reduction), the spread of the light in lateral direction, the kink level, and generating the longitudinal mode.

A second object of the present invention is to provide, in a semiconductor laser which uses a semiconductor of GaN type compound, a semiconductor laser having a current blocking layer comprised of a material capable of absorbing light which is different from the material of a semiconductor of GaN type compound. In such a semiconductor laser, it is possible to control the noise of the oscillated light (for noise reduction), the spread of the light in lateral direction, the kink level, and generating the longitudinal mode.

A third object of the present invention is to provide a semiconductor laser having a high characteristic of low noise suitable for the purpose of use, and to provide a suitable material as the current blocking layer for a blue light emitting semiconductor laser, which uses a semiconductor of GaN type compound, and to provide a semiconductor laser having a stable light resonator for oscillation of blue laser ray by using the material having a characteristic for absorbing the generated light as the semiconductor layers.

A fourth object of the present invention is to provide a manufacturing method in which even in a semiconductor laser which comprises a semiconductor of gallium nitride type compound, it is possible to simply control the current injection area and to get a semiconductor laser having less inactive current.

A fifth object of the present invention is to provide a semiconductor light emitting device in which a problem resulting from the light emitted from the end face of the foregoing conventional semiconductor light emitting device is solved, it is easy to adjust the length of resonator without causing end face deterioration, and it is possible to provide a selectivity in the direction of taking out the generated light.

The semiconductor light emitting device described here is referred to as a semiconductor device which emits light such as an LED which contains a pn junction or a double hetero junction such as a pin or the like, super luminescent diode (SLD), or a semiconductor laser diode (LD).

The semiconductor laser designed to achieve the first object of the present invention is a semiconductor laser comprising:

(a) an active layer comprising a semiconductor of a gallium nitride type compound;

(b) cladding layers sandwiching said active layer comprising an upper cladding layer and a lower cladding layer, said cladding layers comprising a semiconductor of gallium nitride type compound having a band gap energy larger than that of said active layer; and (c) a current blocking layer being provided in at least one of said cladding layers, said current blocking layer being provided with a stripe groove;

wherein said current blocking layer comprises a material which is smaller in the refractive index than that of semiconductor of a compound forming said cladding layers, and different conductive type from a cladding layer in which said current blocking layer is provided or having larger electric resistance than said cladding layers.

The foregoing active layer can be comprised of a semiconductor of $In_xGa_{1-x}N$ (0<x<1), and each of the foregoing upper cladding layer and lower cladding layer can be comprised of a semiconductor of $Al_zGa_{1-z}N$ (0<z<1).

It is preferable that the foregoing current blocking layer comprises a material having an electric resistivity of ten times as large as a semiconductor forming said cladding layers in the neighborhood of said current blocking layer, so that such current blocking layer functions as a layer to block electric current effectively.

In this case, as the material of the foregoing current blocking layer, it is suitable that the material consists of a semiconductor of $Al_yGa_{1-y}N$ (0<y≦1, z<y) in which the composition ratio of Al is greater than that of a compound which forms the foregoing cladding layer in the neighborhood of such current blocking layer. Further, the foregoing current blocking layer may be made from at least either one kind of insulation film selected from a group consisting of $SiO_2$, $Si_3N_4$ and $Al_2O_3$.

It is preferable that the pattern of the foregoing current blocking layer has one configuration and another configuration, said one configuration having a width of $W_1$ and a length of a and said another configuration having a width of $W_2$ and a length of b, a first center line evenly dividing said width $W_1$ of said one configuration and a second center line evenly dividing said width $W_2$ of said another configuration being aligned with each other, said pattern being periodically repeated in the lateral direction with a period of a+b, in order that it is possible to obtain a semiconductor laser which is provided with a compromised structure of the gain guiding structure and the refractive index guiding structure by changing the width $W_1$ and $W_2$, and the length a and b, and is suitable for the desired noise characteristic and semiconductor laser characteristic.

In accordance with the present invention, because a current blocking layer is provided in a cladding layer of a semiconductor laser consisting of a semiconductor of GaN type compound, such current blocking layer being made from a material in which the refractive index is smaller than that of such cladding layer, the conductive type is different from or the electric resistance is greater than that of such cladding layer, it is possible to precisely restrict the current injection area to the stripe width, reflect the light from the active layer totally and return it to the active layer side, without causing absorption or leakage of the light due to the current blocking layer, and to obtain a semiconductor laser of gain guiding structure with high light emitting efficiency. Moreover, when the distance between the current blocking layer and the active layer is made closer, the structure becomes close to a refractive index guiding structure, and when the stripe width to be provided in the current blocking layer is expanded, the distribution angle in the horizontal direction of the light becomes small, so that by adjusting these distance, width and the stripe shape or the like, it is possible to obtain a semiconductor laser in which it is easy to control the noise of the oscillated light (reduction of noise), the spread of light in the lateral direction, the kink level, and generating the longitudinal mode.

The semiconductor laser designed to achieve the second object of the present invention is a semiconductor laser comprising:

an active layer comprising a semiconductor of gallium nitride type compound;

cladding layers comprising an upper cladding layer and a lower cladding layer sandwiching said active layer, said cladding layers comprising a semiconductor of gallium nitride type compound having a band gap energy larger than that of said active layer; and a current blocking layer being provided in at least one of said cladding layers, said blocking layer being provided with a stripe groove;

wherein said current blocking layer is made of a material capable of absorbing light generated in said active layer, and different from said semiconductor of gallium nitride type compound.

The foregoing active layer comprises a semiconductor of $In_xGa_{1-x}N$ (0<x<1), and each of said cladding layers comprises $Al_zGa_{1-z}N$ (0<z<1).

It is preferable that said current blocking layer is a layer having a conductive type opposite to a cladding layer in which said current blocking layer is provided or having large electric resistivity, in order that such current blocking layer works as the layer to block the electric current effectively.

In this case, as the material of the foregoing current blocking layer, Si or Ge is suitable. In addition, the foregoing current blocking layer may be made from at least either one kind of a semiconductor of a compound selected from a group consisting of GaAs, GaP, InP, AlGaAs type compound and AlGaP type compound.

For example, AlGaAs type compound or AlGaP type compound means the whole of a compound semiconductor consisting, for example, of Al, Ga, and As or Al, Ga, and P wherein the mixed crystal ratio of Al and Ga is varied in many ways.

In accordance with the present invention, in the cladding layer of a semiconductor laser consisting of a semiconductor of GaN type compound, a layer which absorbs the light generated in an active layer is provided, and a stripe is formed in such layer to make it a current blocking layer, and therefore, by adjusting the conditions such as the width of the stripe and the distance between the current blocking layer and the active layer, it is possible to design a semiconductor laser in which it is easy to control the spread of light in lateral direction, kink level, and generating longitudinal mode.

The semiconductor laser designed to achieve the third object of the present invention is a semiconductor laser comprising:

an active layer;

cladding layers comprising an upper cladding layer and a lower cladding layer sandwiching said active layer;

a current blocking layer, said current blocking layer being provided in at least one of said cladding layers, said current blocking layer having a current injection area for injecting electric current only into a light emitting area of said active layer; and an absorption layer for absorbing the light generated in said active layer, said absorption layer being provided in at least one of said cladding layers at a determined distance from said active layer.

It is preferable that when both the foregoing absorption layer and the foregoing current blocking layer are provided in the foregoing upper cladding layer, it is possible, in manufacturing, to form easily a cladding layer having a clean crystal in the portion contacting with the active layer sandwiched.

It is preferable that when the foregoing absorption layer is made from a material having a forbidden band gap smaller than that of a cladding layer in which said absorption layer is provided, and having the same conductive type as that of the cladding layer in which said absorption layer is provided, so that it is possible to obtain a suitable material of absorption layer by slightly changing the composition of the semiconductor of that cladding layer.

It is preferable that the foregoing current blocking layer is made of a material which does not absorb the light generated in the foregoing active layer, so that it is possible to adjust the positional relation as an individual parameter by sharing the functions of the absorption layer and the current blocking layer.

In the semiconductor laser of the present invention, there are laminated in order as follows;

a buffer layer made of GaN on a substrate;

a lower cladding layer made of a first conductive type $Al_zGa_{1-z}N$ (0<z<1);

an active layer made of $In_xGa_{1-x}N$ (0<x<1);

an absorption layer made of a second conductive type $In_rGa_{1-r}N$ (0<r<1, r≦x);

a second upper cladding layer made of a second conductive type $Al_zGa_{1-z}N$ (0<z<1);

a current blocking layer consisting of a first conductive type AlN having a stripe-like opening;

a third upper cladding layer made of a second conductive type $Al_zGa_{1-z}N$ (0<z<1);

a second conductive type contact layer;

an upper electrode being provided on said contact layer; and a lower electrode being connected to said lower cladding layer or to said buffer layer.

The first conductive type and the second conductive type described herein are either one and the other of respectively an n-type or a p-type, and mean that, for example, when the first conductive type is of the n-type, the second conductive type is of the p-type, and when the first conductive type is of the p-type, the second conductive type is of the n-type.

It is preferable that, in connection with the active layer consisting of the foregoing $In_xGa_{1-x}N$ (0<x<1) and the absorption layer consisting of the foregoing $In_rGa_{1-r}N$ (0<r<1), when the relation of 0<x/2≦r≦x<1 is held, so that the absorption layer in particular indicates suitable light absorption characteristic. It is preferable that, in connection with the thickness $d_1$ of the foregoing active layer and the thickness of $d_2$ of the foregoing absorption layer, the relation of $d_1/2 \leq d_2 \leq 2d$ is held for the good thickness of the absorption layer.

It is preferable that when the distance t between the foregoing active layer and the foregoing absorption layer is in a range of 0.1 μm ≦t≦0.4 μm, the light generated in the active layer is absorbed in the absorption layer in a range where the laser characteristic can be easily controlled to certain extent.

In accordance with the semiconductor laser of the present invention, in the design of a semiconductor laser which uses a semiconductor of GaN type compound, because the current blocking layer and absorption layer are provided, it is possible to select a suitable material as the current blocking layer, select freely the conditions such as the thickness, position, and material of the absorption layer, and to obtain in the semiconductor laser a resonator having suitable laser oscillation mode which utilizes the absorption characteristic for the generated light. Further, since it is possible to adjust the position to be provided with the absorption layer and to select the material thereof regardless of the current blocking layer, design of semiconductor laser becomes more easy.

In accordance with the manufacturing method of a semiconductor laser designed to achieve the fourth object of the present invention, (d) on a substrate, stacking semiconductor layers of gallium nitride type compound including at least an n-type layer, an active layer, and a p-type layer constituting a semiconductor laser;

(e) activating said p-type layer in a current injection area of said semiconductor layers;

(f) maintaining the p-type layer in an area other than said current injection area of said semiconductor layers in an inactivated state.

It is preferable that the foregoing stacked semiconductor layers comprise an n-type buffer layer, an n-type cladding layer, an active layer, a p-type cladding layer, and a p-type contact layer, so that a semiconductor laser consisting of gallium nitride type compound is manufactured.

It is preferable that the p-type layer is activated by performing heat treatment of the whole substrate after stacking of the foregoing semiconductor layers, and the area other than the foregoing current injection area is turned into a non-activated state by providing a protective film on the surface of the foregoing current injection area and performing heat treatment in an atmosphere containing hydrogen, so that it is possible to positively cause the non-current injection area to have high resistance, and to control the current injection area.

It is preferable that the heat treatment for activating the foregoing p-type layer is performed in a nitrogen atmosphere at 400 to 800° C., so that even if the heat treatment is performed without providing a protective film on the surface of semiconductor layer, N in the semiconductor layer of gallium nitride type compound is difficult to evaporate, the process becomes simple, and deterioration of the semiconductor layer does not occur.

It is preferable that by irradiating electron beam only into the foregoing current injection area after stacking of the foregoing semiconductor layers, and also by activating only such current injection area of the foregoing p-type layer, it is possible to easily control the current injection area with the least number of process.

In accordance with the manufacturing method of a semiconductor laser of the present invention, by utilizing the nature that, in the p-type layer of a semiconductor layer of gallium nitride type compound, the dopant Mg or Zn is coupled with H in the carrier gas or the reactant gas and is easily inactivated, it is performed to anneal only the current injection area of the p-type layer by performing heat treatment or irradiation of electron beam. By virtue of this, H which is coupled with Mg or Zn is separated and discharged, the resistance of the current injection area of the p-type is low, and on the other hand, the resistance of the non-current injection area is high, because the impurity concentration of p-type becomes low by that N of the semiconductor of gallium nitride type compound evaporates, or because the dopant is difficult to move and becomes inactive by coupling the dopant Mg or Zn with H.

In other words, after the p-type layer of the semiconductor of gallium nitride type compound is formed, and after the whole is heat-treated and the p-type layer activated, by providing a protective film only on the surface of the current injection area and by heat treating in an atmosphere of H such as $H_2$ or $NH_3$, it is possible to prevent entry of H into the portion provided with the protective film and to prevent evaporation of N or the like from the semiconductor layer, but H enters into the semiconductor layer in the portion where the protective film is not provided, couples with the dopant Mg or Zn, becomes inactivated, and N is evaporated from the semiconductor layer and the impurity concentration of p-type becomes low. For this reason, a protective film is provided on the surface of the current injection area, and by sufficiently heat treating it in an atmosphere where H exists, it is possible to provide only the non-current injection area with high resistance.

Furthermore, by utilizing inactivation during epitaxial growth of the p-type layer, or after promoting further the inactivation of the p-type layer under a hydrogen atmosphere, and by irradiating electron beam into the current injection area only, it is possible to control the current injection area with high accuracy, because it is possible to control the electron beam irradiation finely, and to anneal only the irradiated portion to have low resistance.

In the semiconductor light emitting device having double hetero junction designed to achieve the fifth object of the present invention comprising:

cladding layers stacked on a subsrate; and an active layer interposed between said cladding layers, said active layer being made of a material having band gap energy smaller than that of said cladding layers;

wherein at least one end face of said active layer is formed with an inclined surface of 45° with respect to a surface of semiconductor layers including said cladding layers, so that a light from said active layer reflected on said one end face can advance in the direction perpendicular to said surface.

It is preferable that a reflection film is provided on the surface of the foregoing inclined surface, so that it is possible to reflect the light completely on the end face.

It is preferable that the foregoing inclined surface is formed in a direction in which the light from the foregoing active layer is caused to reflect toward the side of the foregoing substrate, such substrate consists of a material which is transparent with respect to the light generated in the foregoing active layer, and the light is emitted from the reverse side of such substrate, so that it is possible to adjust the emission rate of the light on the reverse side of the substrate.

In the semiconductor laser designed to achieve the fifth object of the present invention, the structure thereof is such that, in the foregoing semiconductor light emitting device, a stripe-like current injection area is provided so as to form a light emitting portion in said active layer, both end faces of said stripe-like light emitting portion are inclined in the direction whereby a light from said light emitting portion is reflected to advance in the direction of the side of said substrate;

wherein a reflection film is provided in two irradiating locations on the reverse side of said substrate so that part of said light is irradiated from said reflection film portion and a remainder of said light is reflected using said reflection film as one wall surface of a resonator.

It is preferable that the foregoing reflection film consists of multi-layer coating film of a dielectric, and the reflective index is adjusted, so that it is possible to adjust the refractive index on the wall of the resonator.

It is preferable that if the structure is such that in which a metallic film is provided on one side of the foregoing irradiating locations so as to reflect the light completely, it is possible to increase the output of the laser light (the laser light irradiated from one side of the irradiating locations) as the output to be used.

It is preferable that a photodetector for output monitoring is provided on one side of the foregoing irradiating locations, so that it is possible to know the light emitting state.

It is preferable that a semiconductor circuit element is provided on the reverse side of the foregoing substrate, so that it is possible to adjust the output of the emitted light while monitoring the output of the irradiated light.

It is preferable that the semiconductor circuit element contains a photodetector, so that it is possible to form a logical operational circuit and a monitor circuit with one chip.

It is preferable that an optical element is provided on at least one side of the foregoing irradiating locations of the reverse surface of the foregoing substrate, so that it is possible to achieve reduction of the size of the element and adjust the direction of the laser beam of the semiconductor laser and the position of the optical element.

It is preferable that a semiconductor layer is provided on the reverse surface of the foregoing substrate, the reflection film on the foregoing irradiating locations is formed on the basis of a difference of the refractive index between such semiconductor layer and the foregoing substrate, and an output window is provided in the foregoing semiconductor layer portion of at least one side of such irradiating locations, so that it is possible to form the reflection film and the semiconductor chip at one time without providing the reflection film and the semiconductor chip separately.

In accordance with the light emitting device of the semiconductor of the present invention, the light generated in the active layer is guided in the active layer to reach the end face, but the end face is made an inclined surface of 45° with respect to the surface of the semiconductor layers stacked, that is, the active layer, and therefore the light is totally reflected on the inclined surface by the difference of the refractive index between the semiconductor layer and the air, the light is reflected and guided in the direction of the stacked semiconductor layers. As a result, the light is emitted from the reverse side of the substrate or from the top surface side of the semiconductor layers, so that it is possible to eliminate such the energy loss that it occurs when the light is irradiated from the end face of the active layer, and to prevent the harmful influence of the heat generation involved therein.

Further, because the end face is formed by etching, not by the cleavage, it is also possible to make a semiconductor laser of short resonator length.

In accordance with the semiconductor laser of the present invention, because it is possible to emit (irradiate) the laser beam from the reverse surface side of the substrate which is insulator, it is possible to provide a film of total reflection such as a metallic film or the like as the wall of the resonator, which does not cause the fear of short in the stacked semiconductor layers. Further, it is possible to provide an optical element such as a hologram or a concave lens in the semiconductor circuit element such as a power controller r in the laser beam emitting (irradiating) portion, so that it is possible to obtain a small-sized semiconductor laser which can be used easily.

DETAILED DESCRIPTION

Embodiment 1

Figure 1:
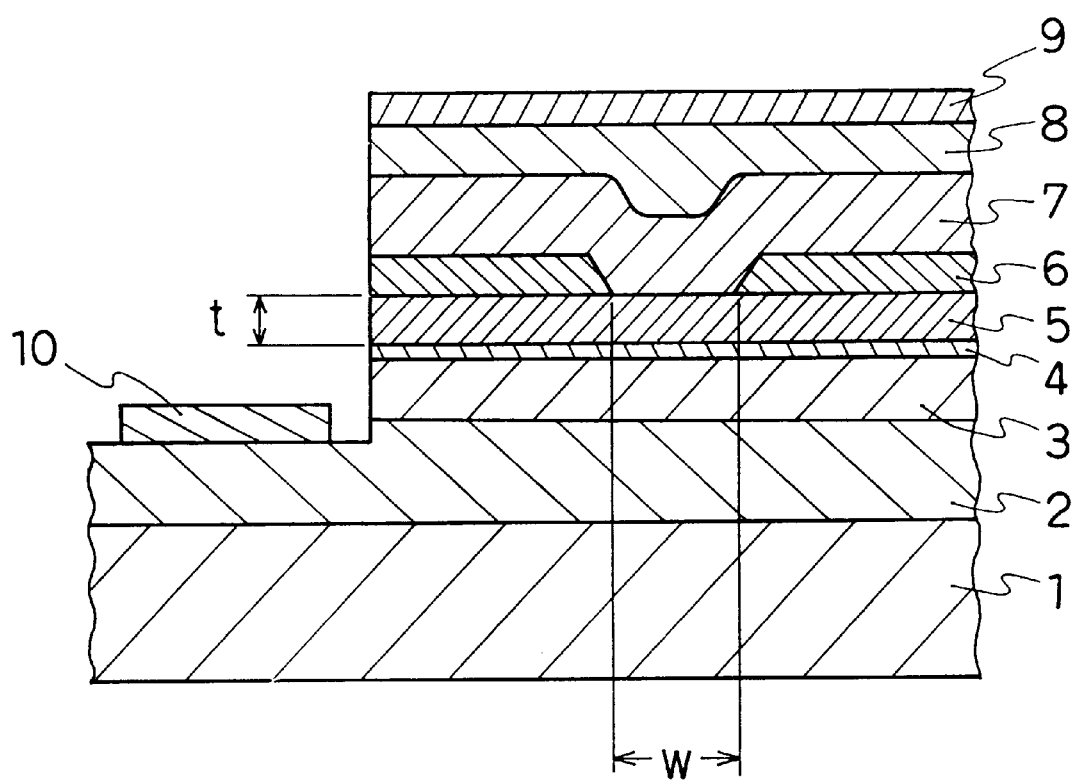
FIG. 1 is an explanatory drawing of a section of an embodiment 1 of the semiconductor laser of the present invention.
Figure 2A:
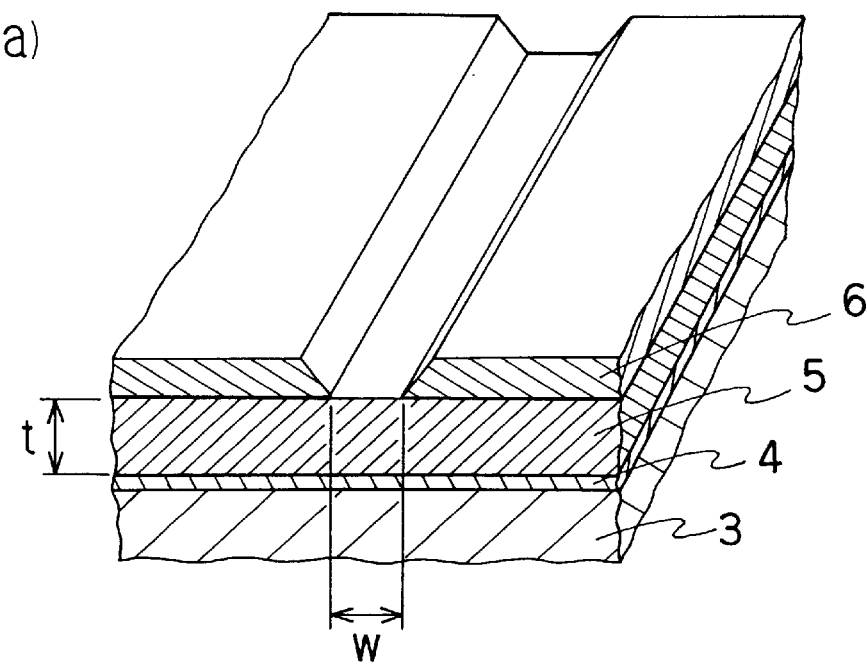
FIGS. 2(a) and 2(b) are respectively a perspective view of the step where the etching of the current blocking layer is performed in the embodiment 1 of the semiconductor laser of the present invention.
Figure 2B:
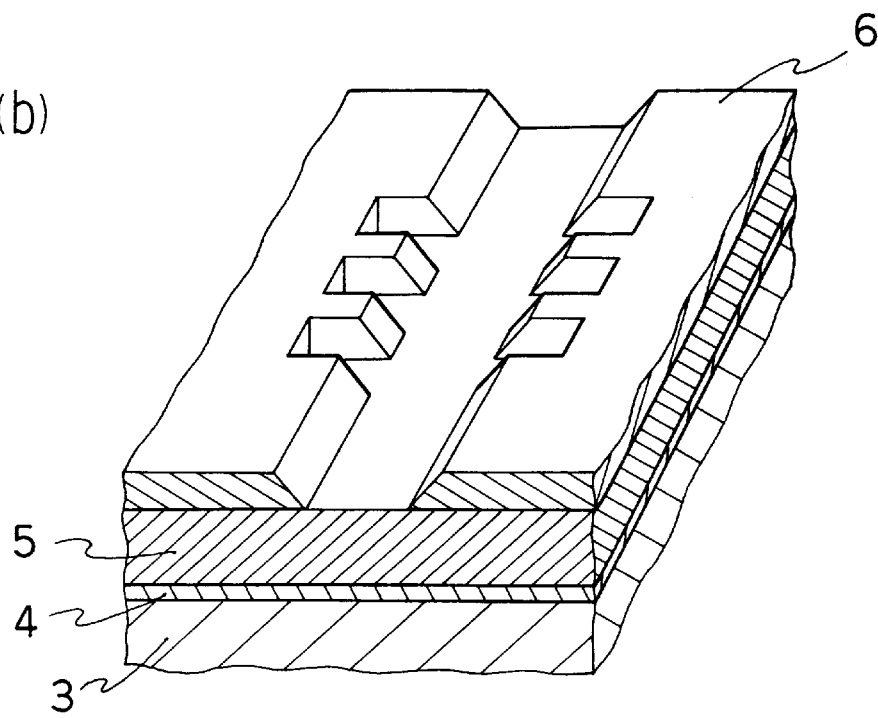
Figure 3A:
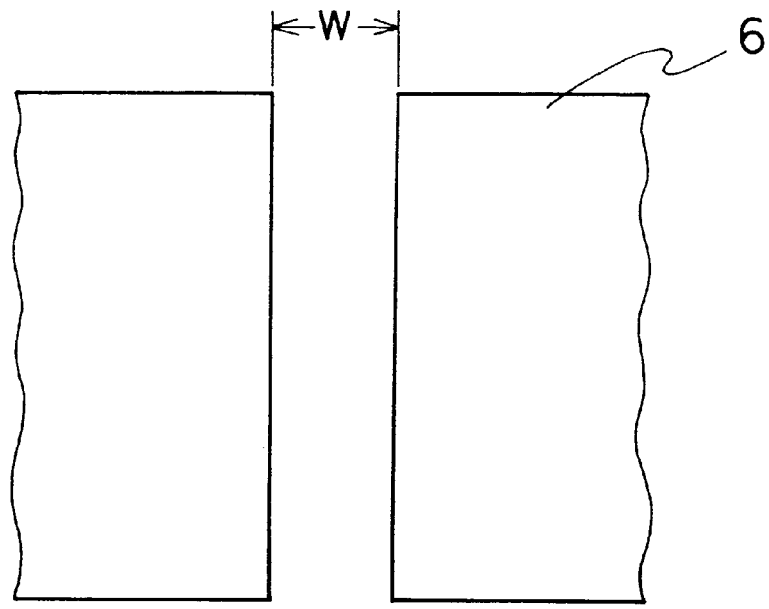
FIGS. 3(a) and 3(b) are respectively a plane pattern drawing of the current blocking layer of FIGS. 2(a) and 2(b).
Figure 3B:
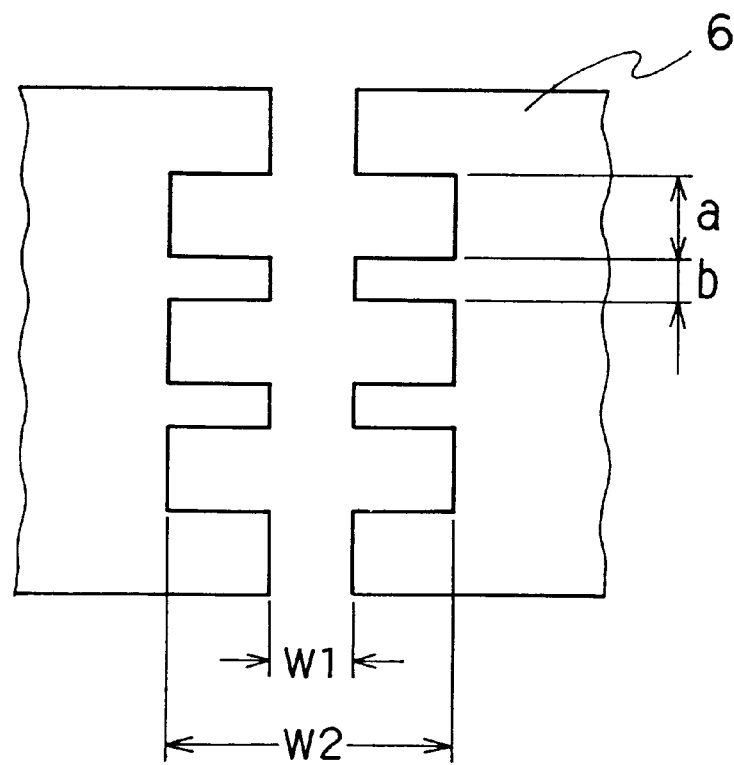

Referring now in detail to the drawings, the semiconductor laser designed to achieve the first object of the present invention will be described. FIG. 1 is an explanatory drawing of a section of an embodiment of a semiconductor laser of the present invention, FIGS. 2(a) and 2(b) are respectively a perspective view showing an example of the step where the etching of a current blocking layer is performed, and FIGS. 3(a) and 3(b) are respectively a plane pattern drawing of FIGS. 2(a) and 2(b).

In FIG. 1, there are respectively laminated (stacked) in order on a substrate 1 consisting of sapphire (single crystal of $Al_2O_3$) or the like, about 2 to about 5 μm of a buffer layer 2 consisting, for example, of an n-type GaN, about 0.1 to about 0.3 μm of a lower cladding layer 3 consisting of an n-type $Al_zGa_{1-z}N$ (0<z<1, where z=0.2 for example), about 0.05 to about 0.1 μm of an active layer 4 consisting of a non-doping type or n-type or p-type $In_xGa_{1-x}N$ (0<x<1, where x=0.15 for example), about 0.1 to about 0.3 μm of a first upper cladding layer consisting, for example, of a p-type $Al_zGa_{1-z}N$, about 0.1 to about 0.4 μm of a current blocking layer 6 consisting of an n-type $Al_yGa_{1-y}N$ (0<y≦1, z<y), about 0.5 to about 2 μm of a second upper cladding layer 7 consisting of a p-type $Al_zGa_{1-z}N$, and about 0.3 to about 2 μm of a contact layer 8 consisting of a p-type GaN. And an upper electrode 9 consisting of Au or the like is provided on the surface of the laminated body and a lower electrode 10 is provided in a portion of the laminated body which is etched from the surface thereof to a position where the lower cladding layer 3 or the buffer layer 2 is exposed. The current blocking layer 6, as shown in FIG. 2(a), has a stripe-like opening formed by removing part thereof by etching so as to form a current path for the electric current flowing to the active layer.

Each of these semiconductor layers is laminated by the metal organic chemical vapor deposition method (hereinafter called as the MOCVD), and in the course of the laminating process thereof is provided the etching process of the current blocking layer 6.

In order to restrict the current injection area in the embodiment 1, the current blocking layer 6 formed with the stripe groove is consisted of a material such as $Al_yGa_{1-y}N$ (including AlN) which has smaller refractive index, and opposite conductive type or larger electric resistivity as compared with the cladding layer in the neighborhood of the current blocking layer 6, that is, in the foregoing structure the first upper cladding layer 5.

By decreasing the refractive index of the current blocking layer, total reflection of the light from the active layer becomes easy and the absorption or leakage of the light is restricted, so that the light emitting efficiency is improved. Further, because the light is not absorbed, changes in the refractive index outside of the stripe of the active layer are difficult to occur and the gain guiding structure can be obtained easily, but by decreasing the distance t between the current blocking layer 6 and the active layer 4, the nature of the refractive index guiding structure appears, so that it is possible to easily obtain a semiconductor laser of the desired characteristic by adjusting the conditions such as the distance t, the width W of the stripe, and the shape of the stripe.

With respect to the current blocking layer 6, a material which blocks electric current, does not absorb nd does not leak to the outside the light generated in he active layer 4 is selected, that is, the material in which the conductive type is different from the conductive type of the cladding layer in the neighborhood thereof, or the electric resistance is larger, and the refractive index is smaller than those of the material of the active layer 4 or the cladding layers 3, 5, and 7. As an example of such material, in addition to the foregoing $Al_yGa_{1-y}N$ (including AlN), insulator such as $SiO_2$, $Si_3N_4$, $Al_2O_3$ or the like can be used.

In a semiconductor of GaN type compound such as a semiconductor of $Al_yGa_{1-y}N$, when the composition ratio of Al is increased, the refractive index generally becomes small. When the composition ratio of Al is increased, the band gap energy is also increased and a material having the band gap energy larger than that of the active layer 4 is used for the cladding layers 3, 5, and 7, therefore, a material (including AlN) of composition ratio of Al larger than that of the cladding layer 5 and 7 in the neighborhood is used for the current blocking layer 6, so that it is possible to reflect the light without absorbing it.

In addition, because the refractive index of $SiO_2$, $Si_3N_4$ or $Al_2O_3$ is 1.46, 2.05, and 1.6 respectively and is smaller than that of 2.25 of the cladding layer such as $Al_{0.5}Ga_{0.5}N$, it is possible to obtain the effect of similar light reflection. Further, these are insulators and can block electric current. In the case the foregoing $Al_yGa_{1-y}N$ is used, by providing a conductive type (an n-type for example) different from the cladding layer 5 (p-type), electric current can be blocked by the gap energy of the pn junction, but the electric resistivity may be increased by decreasing the carrier density. In this case, when the electric resistivity is more than 10 times that of the cladding layers 5 and 7, the leakage current is less than 1/10 and it can be used sufficiently.

In order to form a semiconductor layer consisting of $Al_yGa_{1-y}N$ in the cladding layer, it is made possible by increasing the flow rate of trimethyl aluminum, decreasing the flow rate of trimethyl gallium, and by vapor phase growth by the MOCVD method continuously in the same manner as the forming of the cladding layer 5 or the like. In addition, in order to form an $SiO_2$ film or an $Si_3N_4$ film, the semiconductor is taken out once from the MOCVD apparatus and such film is formed by the PCVD method or the like. An $Al_2O_3$ film is formed by the sputtering method or the like.

In accordance with the semiconductor laser of the embodiment 1, because the current blocking layer 6 consists of a material which does not absorb the light and is low refractive index, both the width W of the stripe of the current blocking layer 6 and the distance t between the current blocking layer 6 and the active layer 4 shown in FIG. 2(a) and FIG. 3(a) are used as the parameters in designing a semiconductor laser, for example, when W is increased from 4 to 10 μm, the spreading angle of the laser beam becomes small, and when W is decreased to less than 3 μm, the spreading angle of the laser beam becomes large. Normally, the width W is set to about 1 to about 15 μm. On the other hand, when t is made smaller, the operating current is decreased, and when t is made larger, the operating current increases. Normally, t is set to about 0.1 to about 0.5 μm.

As shown in FIG. 2(b) and FIG. 3(b), the stripe shape can be made a zigzag shape. In the structure shown in FIG. 2(b) and FIG. 3(b), the center line of the stripe is the same, and the stripe of different width of $W_1$ and $W_2$ and of the length a and b respectively is provided repeatedly for N times. By providing the current blocking layer with such pattern, as compared with the straight pattern shown in FIG. 2(a), scattering, reflection, and absorption of light increase in the wave guide path. By utilizing such characteristic and by combining $W_1$, $W_2$, a, b, t, and the characteristic peculiar to the material (refractive index and absorptivity) the current blocking layer, manufacturing of a semiconductor laser with noise restricted to a low level can be simplified further. For example, when the composition ratio of Al of the current blocking layer 6 is increased, the structure becomes close to a refractive index guiding structure.

Further, in the embodiment 1, a structure is described in which a current blocking layer is provided in an upper cladding layer, but it is also possible to provide the current blocking layer in a lower cladding layer.

Next, the manufacturing method of the foregoing semiconductor laser will be described as follows.

First, a substrate 1 consisting of sapphire or the like was installed in a reaction tube, the carrier gas $H_2$ was introduced at 10 slm, the reactant gas trimethyl gallium (hereinafter called as TMG) was introduced at 100 sccm, and $NH_3$ was introduced at 10 slm, and a low temperature buffer layer 1 is grown in vapor phase by the MOCVD method at 400 to 700° C., which is a polycrystalline film consisting of GaN of about 0.01 to about 0.2 μm thickness. Then, when the temperature was increased to 700 to 1200° C., the low temperature buffer layer was left to stand for about 5 to about 15 minutes so as to turn the polycrystalline film into a single crystalline film, and by introducing thereon the same material gas as the foregoing material gas and by subjecting to the vapor phase reaction at high temperature of 700 to 1200° C., a high temperature buffer layer consisting of single crystal of GaN is formed to a thickness of 2 to 5 μm and a combination of the low temperature buffer layer and the high temperature buffer layer was named the buffer layer 2.

Further, by mixing trimethyl aluminum hereinafter called as TMA) at the flow rate of 10 to 100 sccm to cause the vapor phase reaction, a lower cladding layer 3 consisting of an n-type $Al_zGa_{1-z}N$ was deposited to a thickness of 0.1 to 0.3 μm.

Next, the dopant $SiH_4$ was stopped, and in place of TMA, trimethyl indium (hereinafter called as TMI) was supplied at the flow rate of 10 to 200 sccm to form about 0.05 to about 0.1 μm of a non-doping type active layer 4 consisting of $In_xGa_{1-x}N$, and the material gas of the same composition as that of the n-type lower cladding layer 3 was supplied, and as the impurity material gas biscyclopentadienil magnesium (hereinafter called as $Cp_2Mg$) or dimethyl zinc (hereinafter called as DMZn) was introduced at the flow rate of 10 to 1000 sccm to form about 0.1 to about 0.3 μm of the p-type first upper cladding layer 5 consisting of $Al_zGa_{1-z}N$, and then the material gas TMA was supplied at the flow rate of 20 to 200 sccm, TMG was supplied at the flow rate of 100 sccm, and $SiH_4$ was supplied as the dopant gas to form about 0.1 to about 0.5 μm of an n-type $Al_yGa_{1-y}N$ ($0<y\leq1$) layer as the current blocking layer.

Afterward, the furnace temperature was lowered to approximately 30° C., the substrate with a semiconductor layers laminated thereon was taken out from the MOCVD apparatus, etched by the photo-lithographic process to form a stripe groove, and the current blocking layer 6 was formed.

Afterward, the substrate was placed into the MOCVD apparatus again, the temperature was set to 700 to 1200° C., the reactant gas of TMG, $NH_3$, and TMA and the dopant gas of $Cp_2Mg$ or DMZn were supplied in the same manner as stated above, 0.5 to 2 μm of the second upper cladding layer 7 consisting of the p-type $Al_zGa_{1-z}N$ was deposited, and then, the supply of TMA was stopped, and about 0.2 to about 3 μm of the contact layer 8 consisting of GaN was deposited in order. Afterward, a protective film such as $SiO_2$ and $Si_3N_4$ was provided all over the surface of the semiconductor layers stacked, and then annealed for about 20 to about 60 minutes at 400 to 800° C., so that the p-type cladding layers 5 and 7 and the contact layer 8 were activated.

Next, in order to provide the lower electrode 10, a mask was formed by a resist film or the like, part of the semiconductor layers laminated under the atmosphere of $Cl_2$ gas was etched by reactive ion etching, until the n-type layer, that is, the lower cladding layer 3 or the buffer layer 2 was exposed. And then on the contact layer 8 was formed the upper electrode 9 consisting of Au, Au—Zn or the like, on the n-type layer was formed the lower electrode 10 consisting of Au—Ge or the like, and a chip of the semiconductor laser was formed by dicing (refer to FIG. 1 ). In the case the substrate 1 is not of an insulation substrate such as sapphire but is of a semiconductor substrate, it is possible to provide a lower electrode on the reverse surface without etching part of the laminated body.

In accordance with the semiconductor laser of the embodiment 1, it is not necessary to etch and remove part of the semiconductor layers on both side thereof so as to form a current path, so that the loss of the light due to the damage that could result possibly otherwise is eliminated, and a blue light emitting semiconductor laser with improved light emitting efficiency can be obtained. In addition to the patterning shape of the current blocking layer, by adjusting the distance between the active layer and the current blocking layer, a suitable resonator is formed in the semiconductor laser.

Embodiment 2

The embodiment 2 is different from the embodiment 1 only in that the current blocking layer 6 of the embodiment 1 consists of the n-type Si and formed to a thickness of about 0.2 to about 0.5 μm, and other structures are the same as those of the embodiment 1 referring to FIG. 1, and therefore, the description thereof will be omitted here.

In the embodiment 2, in order to restrict the current injection area, the current blocking layer 6 formed with the stripe groove is made up of a material, such for example as Si which is different from the GaN type semiconductor, which absorbs the light generated in the active layer 4, in addition to the function as the layer to restrict the current injection area, by absorbing the light generated in the active layer 4, a difference of the refractive index is provided in the lateral direction (outside of the stripe area) of the active layer so as to form a refractive index guiding structure.

As the current blocking layer 6, a material which absorbs the light generated in the active layer 4, that is, a material wherein the band gap energy is smaller and the refractive index is larger than those of the active layer 4 is selected. As an example, in addition to the foregoing Si, it is possible to use materials such as Ge, GaAs, GaP, InP, AlGaAs type compound, and AlGaP type compound. It is preferable from the viewpoint of the lattice matching that the current blocking layer to be provided in the semiconductor of GaN type compound is originally made from GaN type compound, but as the material which satisfies the foregoing band gap energy, it is necessary to increase the composition ratio of In as stated above, so that it is not possible to obtain a semiconductor layer of good film quality. Therefore, as the result of repeated and earnest studies by the inventor of the present invention, it was discovered that although different from the semiconductor of GaN type compound, it is possible to obtain a highly characteristic semiconductor laser in which the current blocking layer absorbs the light emitted from the active layer and semiconductor layers have good quality, by using the group IV element such as Si or Ge having good lattice matching with $Al_zGa_{1-z}N$ as the cladding layer, or GaAs type compound or GaP type compound (including those in which part of Ga is replaced by other group III element such as Al, in addition to GaP) or a semiconductor of InP type compound rather than a semiconductor of GaN type compound having large composition ratio of In.

In order to form a semiconductor layer consisting of Si or Ge in a cladding layer, by using the MOCVD method with the temperature thereof set at 500 to 1000° C. and by replacing the gas to be introduced by $SiH_4$, $GeH_4$ or the like, and the dopant gas $PH_3$ or the like, it is possible to grow a single crystal layer or n-type Si or n-type Ge under vapor phase reaction. In order to grow GaAs or GaP, by introducing the tertiary butyl arsine (hereinafter called as TBA) which is the material gas of As and the material gas of Ga and the tertiary butyl phosphine (hereinafter called as TBP) which is the material gas of P, it is possible to grow in the same manner a single crystal such as GaAs or GaP.

In accordance with the semiconductor laser of the embodiment 2, because the current blocking layer 6 consists of a light absorption material, both the stripe width W of the current blocking layer 6 and the distance t between the current blocking layer 6 and the active layer 4 are used as the parameter in designing a semiconductor laser, and for example, when t is increased by more than 1 μm, a structure (gain guiding mode) wherein the current injection area is controlled can be obtained and a semiconductor laser with low noise can be obtained. Further, when t is made smaller than 0.1 μm, a structure (refractive index guiding mode) wherein the refractive index is controlled can be obtained and the kink level becomes high. On the other hand, it is also possible to obtain a structure having a large spreading angle of the laser beam to be emitted by making W small, and it is also possible to obtain a structure having a small spreading angle of the laser beam by making W large. For example, when W is 2 μm, the spreading angle is about 15°, and when W is 4 μm, the spreading angle is about 9°, and the laser beam of this spreading angle 9° is generally used extensively.

In the embodiment 2, it is structured to provide the current blocking layer in the upper cladding layer, but it is also possible to provide it in the lower cladding layer.

With respect to the manufacturing method of the semiconductor laser of the embodiment 2, the semiconductor laser is manufactured in quite the same manner as the embodiment 1. However, in order to form an n-type Si layer which is to be the current blocking layer 6, by supplying $SiH_4$ as the material gas and TBP as the dopant gas, about 0.15 to about 0.5 μm of an n-type Si layer was deposited.

In accordance with the semiconductor laser of the embodiment 2, in a semiconductor laser comprising a semiconductor of gallium nitride type compound, because the light generated in the active layer is absorbed by the current blocking layer, it is possible to obtain a very effective structure in designing the resonance mode of the laser beam. Especially, by adjusting the stripe width W of the current path which is to be the parameter, and the distance t between the active layer and the absorption layer, it is possible to adjust the wave guide state of the light. Further, by considering the refractive index or the like of the wave guide path (and the up and down and right and left materials), calculation utilizing computer simulation becomes possible, and thus the design of semiconductor laser is made easy.

Embodiment 3

Figure 4:
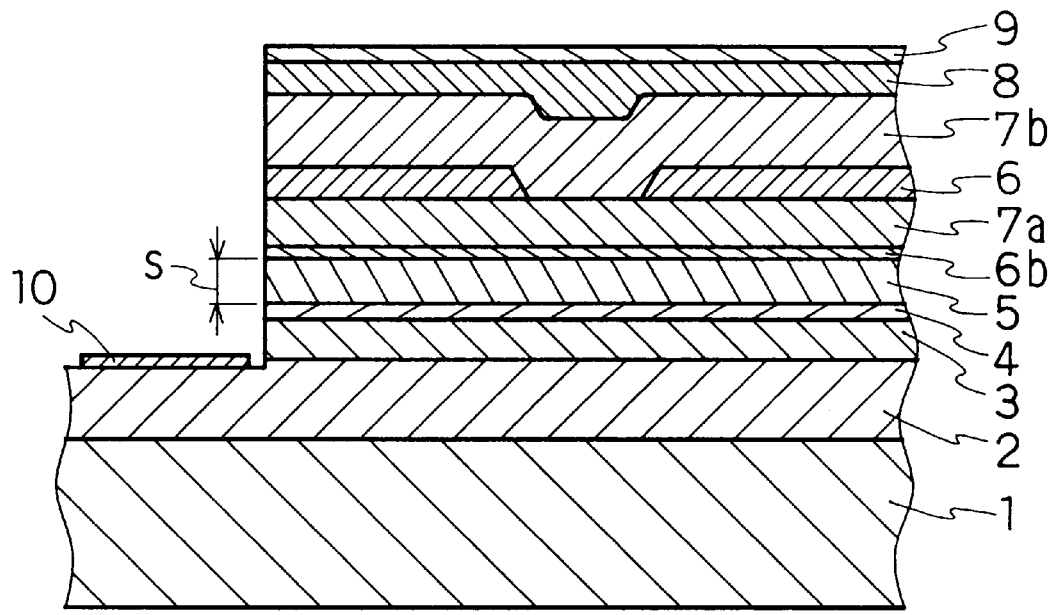
FIG. 4 is an explanatory drawing of a section of the semiconductor laser of an embodiment 3.

FIG. 4 is an explanatory drawing of a section showing an embodiment of the semiconductor laser of the embodiment 3. The portion of the same kind as that of the embodiment 1 shown in FIG. 1 is designated the same symbol. In FIG. 4, there are respectively laminated in order on a substrate 1 consisting of sapphire (single crystal of $Al_2O_3$) or the like, about 2 to about 5 μm of a buffer layer 2 consisting of GaN of a first conductive type (such as an n-type), about 0.1 to about 0.3 μm of a lower cladding layer 3 consisting of $Al_zGa_{1-z}N$ (0<z<1, where z=0.2 for example) of a first conductive type, about 0.05 to about 0.1 μm of an active layer 4 consisting of a non-doping type or n-type or p-type $In_xGa_{1-x}N$ (0<x<1, where x=0.2 for example), about 0.1 to about 0.3 μm of a first upper cladding layer 5 consisting of $Al_zGa_{1-z}N$ of a second conductive type (such as a p-type), about 0.03 to about 0.2 μm of an absorption layer 6b consisting of $In_rGa_{1-r}N$ (0<r<1, where r=0.1 for example) of a second conductive type, about 0.1 to about 0.3 μm of a second upper cladding layer 7a consisting of $Al_zGa_{1-z}N$ of a second conductive type, about 0.1 to about 0.4 μm of a current blocking layer 6 consisting of AlN of a first conductive type, about 0.5 to about 2 μm of a third upper cladding layer 7b consisting of a second conductive type $Al_zGa_{1-z}N$, and about 0.3 to about 2 μm of a contact layer 8 consisting of GaN of a second conductive type. The upper electrode 9 and the lower electrode 10 and the opening portion of the current blocking layer 6 are provided in the same manner as that of the embodiment 1.

In the embodiment 3, for the purpose of only restricting the current injection area, the current blocking layer 6 formed with the stripe groove is composed of a material which does not absorb the light generated in the active layer 4, so that the current blocking layer 6 functions only as a layer for restricting the current injection area, and for the purpose of absorbing the light generated in the active layer 4, the absorption layer 6b apart from the current blocking layer 6 is provided. The absorption layer 6b functions as a layer for providing the difference of the refractive index in the lateral direction (outside of the stripe area) of the active layer 4 to make a refractive index guiding structure, or to cause self-oscillation. And absorbing characteristic is made adjustable regardless of the stripe width of the current blocking layer 6 by adjusting the thickness of the absorption layer 6b provided separately and the distance between the active layer 4 and the absorption layer 6b, so that it is possible to obtain easily the desired noise characteristic and other electric characteristic of semiconductor laser.

As the current blocking layer 6, a material which does not absorb the light generated in the active layer 4, that is, a material having the band gap energy larger than that of the material of the active layer 4 and the cladding layers 3, 5, 7a, and 7b and the refractive index smaller than that of the active layer 4 and the cladding layers 3, 5, 7a, and 7b, is selected. As an example of such material, it is possible to use materials such as $Al_2O_3$, $SiO_2$, and $Si_3N_4$ in addition to the foregoing AlN. In the embodiment 3 the width of the stripe can be determined based on the spreading angle in the horizontal direction of the light, so that other conditions such as the noise characteristic is not influenced.

The absorption layer 6b is capable of changing the wave guide characteristic and the noise characteristic by changing the refractive index by absorbing the light generated in the active layer 4, so that a material having the band gap energy larger than that of the material of the active layer 4 and the band gap energy smaller than that of the cladding layers 3 and 5, and having the refractive index smaller than that of the material of the active layer 4 and the refractive index larger than that of the material of the cladding layers 3 and 5, is selected.

Figure 5:
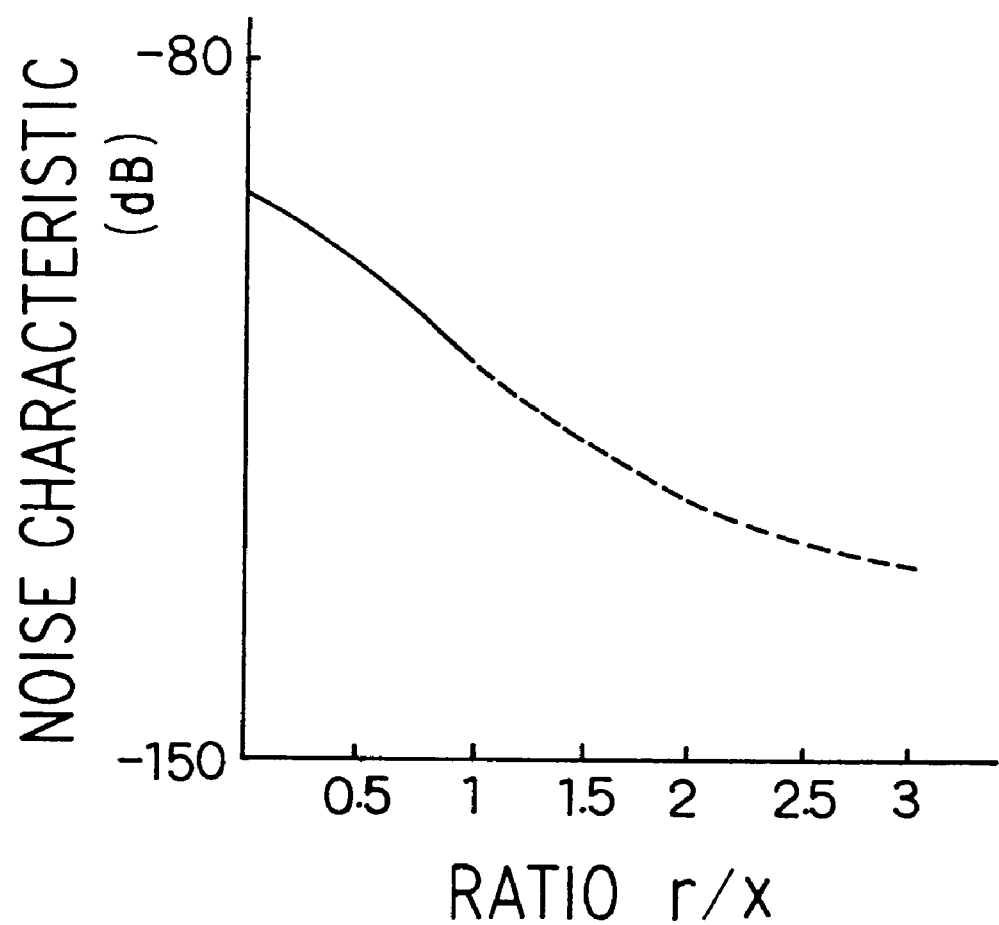
FIG. 5 is a drawing showing the noise characteristic of a semiconductor laser with respect to the composition ratio of In of an absorption layer.

As the result of the investigation of the characteristic of semiconductor laser as to the material of the absorption layer 6b when the composition ratio r of In of the foregoing $In_rGa_{1-r}N$ is changed, it was discovered that there is a correlation with the composition ratio x of In of the active layer 4, and as shown in FIG. 5, the noise characteristic is improved as r/x is made larger, and when the band gap energy is made smaller than that of the material of the active layer, the oscillation characteristic becomes poor, so that it is necessary to establish r≦x. Therefore, by setting r/x to the range of ½ to 1, it is possible to obtain good noise and oscillation characteristics.

Figure 6:
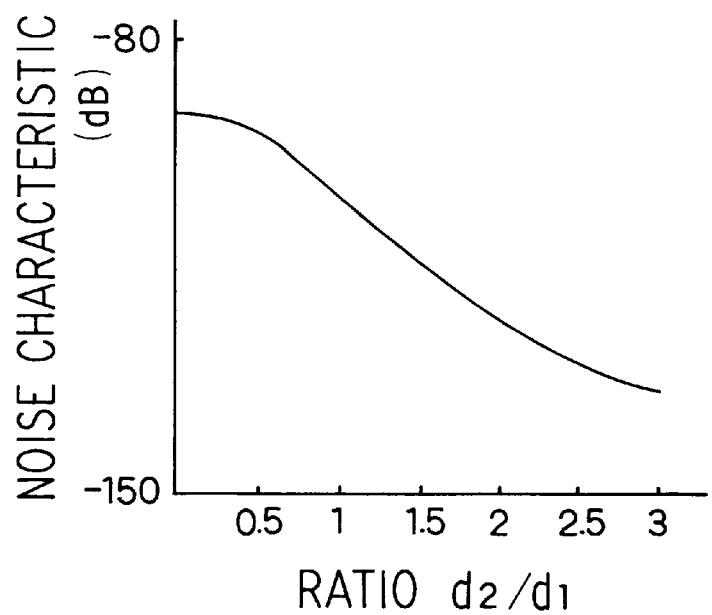
FIG. 6 is a drawing showing the noise characteristic of a semiconductor laser with respect to the thickness of an absorption layer.

Further, when the thickness $d_2$ of the absorption layer 6b becomes large, the noise is generally reduced, but the operating current becomes large, power consumption increases, and the oscillation efficiency is lowered. As the result of various studies concerning the optimum value of the thickness of the absorption layer 6b, it was discovered that there is a correlation of the noise characteristic between the thickness of the absorption layer 6b and that of the active layer 4, and as shown in FIG. 6, when (the thickness $d_2$ of the absorption layer 6b)/(the thickness $d_1$ of the active layer 4) is made larger, the noise characteristic will further be improved. On the other hand, if the absorption layer 6b becomes excessively thick, power consumption is increased, while the leakage current increases and the oscillation efficiency decreased. As a result, by setting the ratio of $d_2/d_1$ to the range of ½ to 2, it is possible to obtain good noise characteristic and oscillation characteristic.

Figure 7:
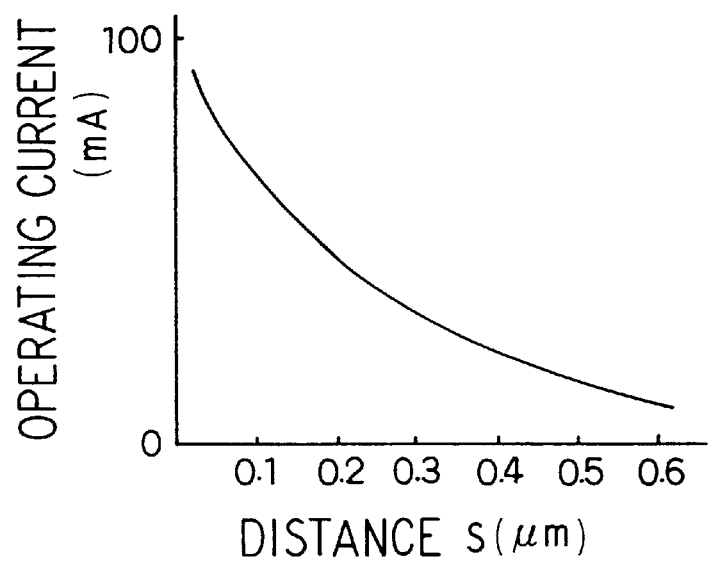
FIG. 7 is a drawing showing the characteristic of the operating current of a semiconductor laser with respect to the distance between an absorption layer and an active layer.

As stated above, the light absorption characteristic of the absorption layer 6b is influenced depending on the thickness of the absorption layer 6b, and with respect to the distance s between the absorption layer 6b and the active layer 4, as the relation to the operating current is shown in FIG. 7, when the distance s is large, the light absorbed by the absorption layer 6b decreases, the operating current is decreased and the noise becomes large, but when the distance s becomes small, the noise is reduced but the operating current becomes large, and the light emitting efficiency is lowered. Further, when the distance s becomes excessively small and comes too close up to a distance where the absorption layer 6b enters the standing wave composed of the light generated by the active layer, oscillation of the laser beam is obstructed. For this reason, in consideration of the oscillation characteristic and the noise characteristic, it was discovered that by setting the distance s between the absorption layer 6b and the active layer 4 to the range of 0.1 $\mu$m≦s≦0.4 $\mu$m, it is possible to obtain good laser oscillation.

In the absorption layer 6b consisting of $In_rGa_{1-r}N$ described in the embodiment 3, when the light is absorbed in excess of certain quantity, the absorption factor becomes small and the refractive index becomes large simultaneously, causing the light to concentrate on the active layer. Further, on the contrary, when the quantity of the light which expands to the absorption layer is reduced, the absorption factor is increased to keep the balance and there occurs self-oscillation phenomenon.

Further, in the embodiment 3, in order to make the cladding layers of the portion contacting with the both sides of the active layer into clean semiconductor crystal, both the absorption layer and the current blocking layer are provided in the upper cladding layer, but it is also possible to provide one of the absorption layer and the current blocking layer under the active layer (in the lower cladding layer) and provide the other over the active layer (in the upper cladding layer). Further, both of those absorption layer and current blocking layer may be provided under the active layer (in the lower cladding layer).

Also, with respect to the manufacturing method of the semiconductor laser of this embodiment, a semiconductor laser is manufactured in the same manner as the embodiment 1 by laminating each semiconductor layer and by forming an electrode. However, depositing the layers from the absorption layer 6b to the current blocking layer 6 is performed in the following manner, and then after depositing the third upper cladding layer 7b each step is performed in the same manner as the forming after the second upper cladding layer 7 of the embodiment 1.

The same material gas TMI as that of the foregoing active layer 4 was supplied at the flow rate of 5 to 100 sccm, the dopant gas $Cp_2Mg$ was introduced to deposit about 0.05 to about 0.2 $\mu$m of the absorption layer 6b consisting of $In_rGa_{1-r}N$, the same material gas as that of the first upper cladding layer 5 was supplied to form about 0.05 to about 0.2 $\mu$m of the second upper cladding layer 7a consisting of $Al_zGa_{1-z}N$, then the dopant $SiH_4$ was supplied to TMA and $NH_3$ to form about 0.15 to about 0.5 $\mu$m of an n-type AlN layer which is to be made into a current blocking layer.

In the semiconductor laser in accordance with the embodiment 3, by the absorption layer provided separately from the current blocking layer for forming a current path in the cladding layer, the design becomes easy wherein the laser characteristic or the noise characteristic or the like is set to a desired characteristic, for example, to generate self-oscillation of the laser beam. By virtue of this, it is possible to obtain a semiconductor laser whose noise is very low in the frequency range in which it can be used practically as the semiconductor laser, and it is possible to obtain a semiconductor laser which stands the disturbance (return light).

Embodiment 4

Figure 8:
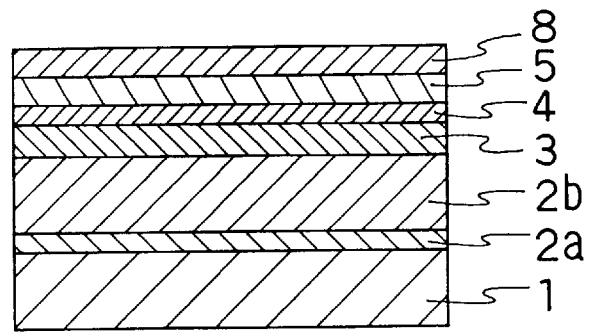
FIGS. 8(a) to 8(c) are an explanatory drawing of the sections of process of the manufacturing method of a semiconductor laser of an embodiment 4.
Figure 8:
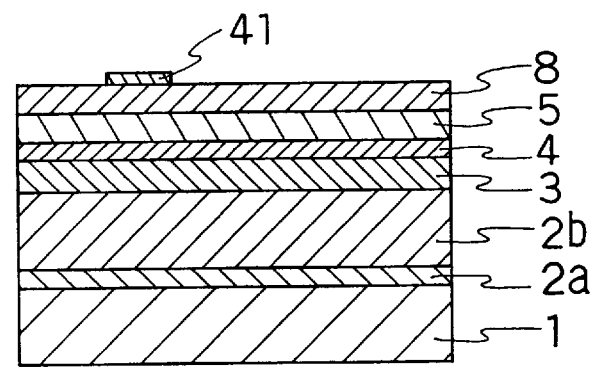
Figure 8:
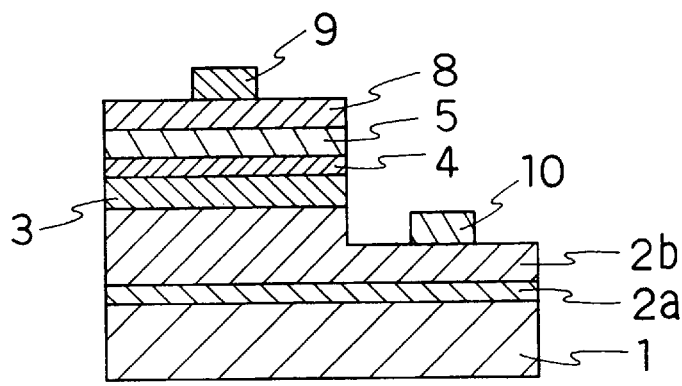
Figure 9:
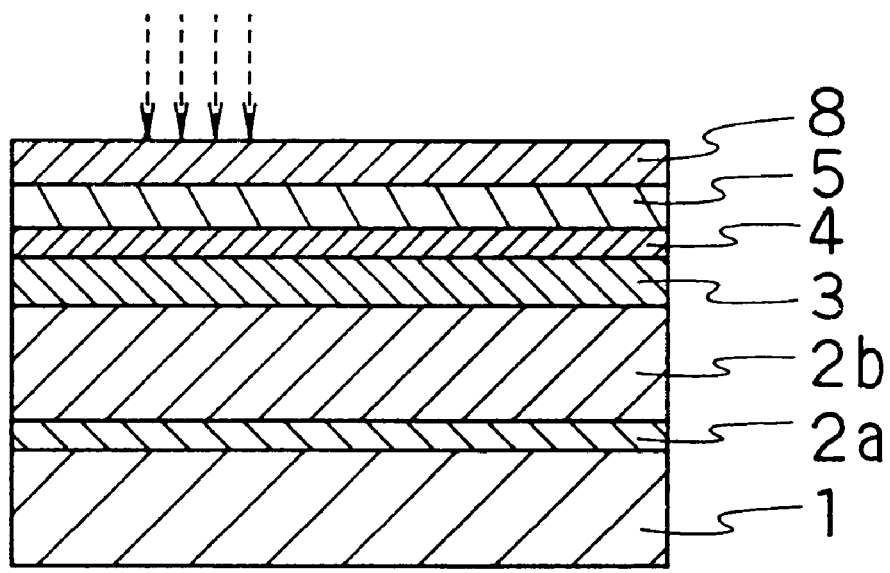
FIG. 9 is a schematic explanatory drawing showing the electron beam irradiation of a second manufacturing method of a semiconductor laser of the embodiment 4.

FIG. 8 is an explanatory drawing of sections of the process of a first manufacturing method of the semiconductor laser of the embodiment 4 and FIG. 9 is an explanatory drawing of a section of the process of a second manufacturing method. The same portion as that shown in FIG. 1 is designated with the same symbols.

The embodiment 4 was obtained based on a knowledge that the p-type layer of the semiconductor of gallium nitride type compound does not function as the low resistance p-type layer unless activation treatment is performed, because the dopant Mg or Zn couples with H during the epitaxial growth process of the p-type layer, so it becomes difficult for the dopant Mg or Zn to move as stated above. In other words, in the semiconductor light emitting device in which a semiconductor of gallium nitride type compound is used, because the p-type dopant does not function sufficiently as the dopant by only through the epitaxial growth of the p-type layer, the dopant Mg or Zn is separated of its coupling with H for activation by heat treatment or electron beam irradiation. In this embodiment, utilizing the property that the inactivated state easily results from the coupling of the dopant Mg or Zn with H and the property that N evaporates from the semiconductor of gallium nitride type compound by heat treatment and the layer thereof approach to an n-type layer, the p-type layer of the current injection area only is activated, and the p-type layer of the non-injection area is inactivated by maintaining the inactivated state caused during the epitaxial growth or by further promoting inactivation by coupling with H, so that the current injection area is controlled.

In order to activate the current injection area and inactivate the non-current injection area, there is a method in which the non-current injection area is inactivated by coupling the dopant of the p-type layer with H after activating the whole of the p-type layer by heat treatment or electron beam irradiation, or by evaporating N of the semiconductor layer of gallium nitride type compound to approach to an n-type layer or high resistance, and a method in which the whole of the p-type layer is inactivated by heat treatment under hydrogen atmosphere during or after the epitaxial growth of the p-type layer, and thereafter the p-type layer of the current injection area only is activated. The examples of concrete manufacturing method will be described as follows.

In the first method, after semiconductor layers consisting of a semiconductor of gallium nitride type compound are laminated on a substrate, they are annealed and activated by heat treatment, then a protective film is provided only on the surface of the current injection area and heat treatment is performed under the atmosphere where H included in $H_2$ or $NH_3$ exists, thereby causing H to enter the semiconductor layer where the protective film is not provided so as to be coupled with the p-type dopant such as Mg and Zn, evaporating N of the semiconductor of gallium nitride type compound so as to provide high resistance, maintaining the activated state by preventing the entry of H into the current injection area by the protective film so as to provide low resistance, so that the current injection area is controlled. Referring in detail to FIGS. 8(a) to 8(c), the manufacturing method of the present invention will be described.

First, as shown in FIG. 8 (a), in the same manner as the manufacturing method of the embodiment 1, on a substrate 1 consisting of sapphire (single crystal of $Al_2O_3$) or the like are deposited a low temperature buffer layer 2a and a high temperature buffer layer 2b consisting of GaN, an n-type cladding layer (lower cladding layer) 3 consisting of $Al_xGa_{1-x}N$ (0<x<1) an active layer 4 consisting of $Ga_yIn_{1-y}N$ (0<y≦1), a p-type cladding layer (upper cladding layer) 5 consisting of $Al_xGa_{1-x}N$, and a contact layer 8 consisting of GaN respectively to only the same thickness as that of the embodiment 1.

Next, the coupling of H with Mg or Zn which is the dopant of the p-type is separated for activation and reduction of resistance. In other words, the whole substrate laminated with the semiconductor layers is placed in a furnace of nitrogen atmosphere and heat treated at 400 to 800° C. for 20 to 60 minutes at about 1 atm. In this case, because the overall temperature increases during heat treatment, N or Ga, and N in particular in the semiconductor of gallium nitride type compound is apt to evaporate, but the evaporation thereof can be prevented since nitrogen is used as the atmosphere gas in the furnace, so that only H which evaporates easily is separated from the coupling with Mg or the like and evaporated. In addition, in order to prevent evaporation of N or Ga, because H easily evaporates even at high pressure of 2 to 100 atms not at 1 atm, it is also possible to activate positively the p-type layer at high pressure. This embodiment is preferable in that by performing activation treatment in the nitrogen atmosphere it is possible to prevent evaporation of N or Ga without providing a protective film on the surface.

Next, the non-current injection area is treated for inactivation (see FIG. 8(b)). Concretely, on the surface of a semiconductor layer in a current injection area only is provided with about 0.05 to about 0.3 μm of a protective film such as $SiO_2$, $Si_3N_4$ and $Al_2O_3$ and heat treatment is performed at 400 to 800° C. for 20 to 60 minutes in a gas atmosphere (1 atm, for example) where H included in $H_2$ or $NH_3$ exists. H in the atmosphere enters into the semiconductor layer of the p-type as the result of the heat treatment, couples with the dopant such as Mg or Zn to become inactivated and is provided with high resistance as stated above. Further, Ga or N in the semiconductor layer is apt to decompose and evaporate during heat treatment, and N in particular is apt to evaporate, the portion provided with the protective film 41 is restricted from evaporation, but N is apt to evaporate in the portion without the protective film 41. Because the p-type layer of the semiconductor of gallium nitride type compound is apt to approach to an n-type layer when N evaporates from the p-type layer, and to be provided with high resistance. As a result, the non-current injection area without the protective film 41 is provided with high resistance. In addition, in forming the foregoing protective film 41, $SiO_2$ or the like is provided over the entire surface of the surface of the semiconductor layers by the CVD method or the sputtering method or the like, and it is possible to provide the protective film 41 only on the necessary portion of only the surface of the current injection area by the ordinary photolithographic process such as exposure and development of the resist film, and etching.

Next, the protective film 41 is removed, a resist film is provided, and by etching part of semiconductor layers laminated by performing reactive ion etching under chlorine gas atmosphere so as to cause the high temperature buffer layer 2b to be exposed, on the surface of the current injection area on the contact layer 8 is provided with a p-side electrode 9 consisting of Au or the like and on the surface of the high temperature buffer layer 2b exposed by etching is provided with the n-side electrode 10 consisting of Al or the like, so that a semiconductor laser chip is obtained by dicing (refer to FIG. 8c)).

When the non-current injection area is provided with high resistance completely, patterning of the electrode is not necessary, and the p-side electrode can be provided over the entire surface of the contact layer 8.

Figure 10:
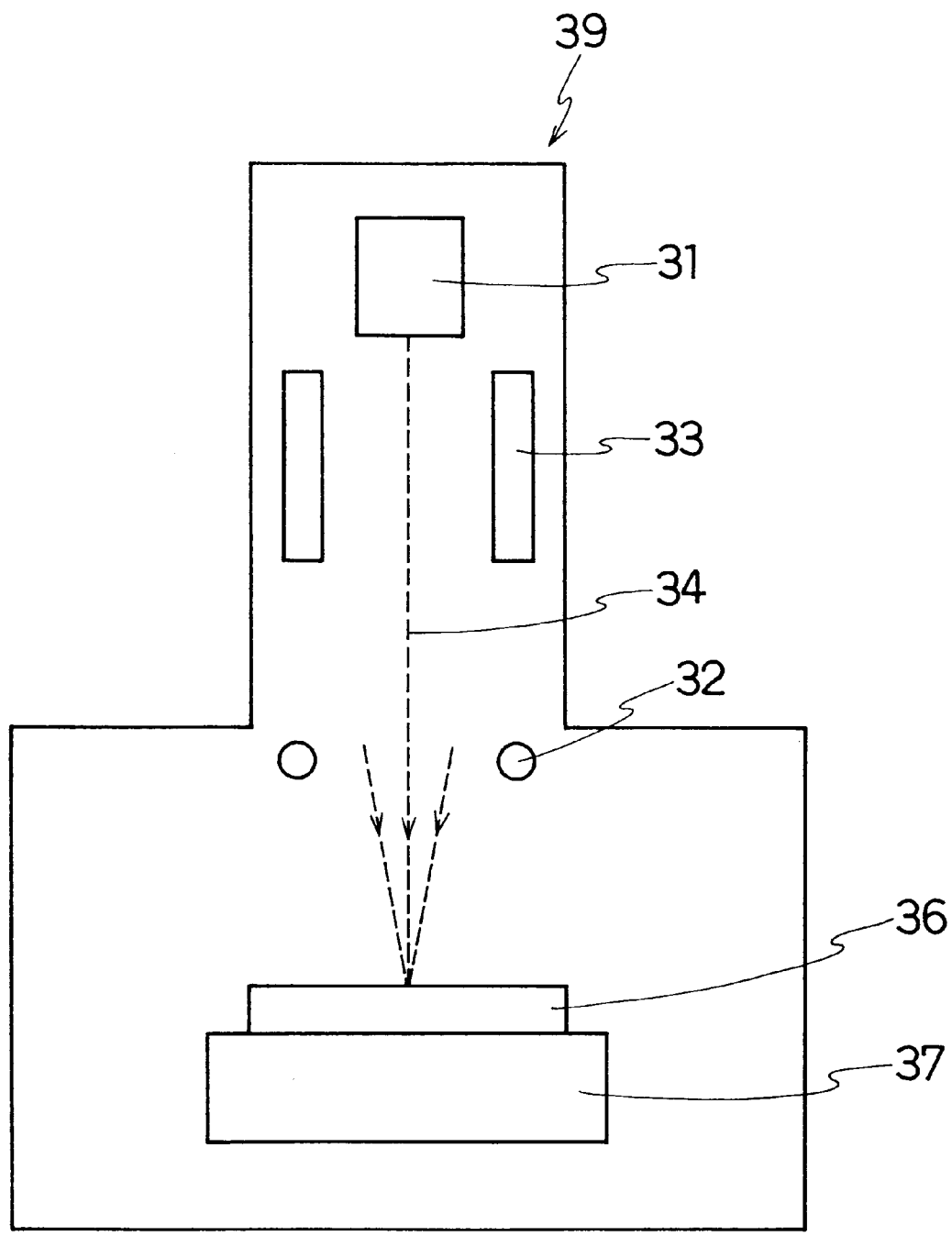
FIG. 10 is a schematic explanatory drawing of an example of an electron beam irradiation apparatus. 10

In the second method of activation, after the epitaxial growth of the p-type layer or after further heat treating the semiconductor layer of the p-type under atmosphere where H included in $H_2$ or NH3 exists, so coupling of the p-type dopant with H or evaporation of N of the semiconductor of gallium nitride type compound is accelerated to provide high resistance, and then electron beam is irradiated to activate only the current injection area so as to provide low resistance for the current injection area only. FIG. 9 is a typical drawing showing irradiation of electron beam only to the current injection area after laminating semiconductor layers. As an electron beam irradiation apparatus, as the conceptual drawing shown in FIG. 10 for example, it is possible to use an ordinary electron irradiation apparatus 39 comprising components such as an electron gun 31, electron beam scanning unit 32, and electron beam concentration system 33, but it is preferable to use an electron beam irradiation apparatus for manufacturing a mask or for direct wafer patterning because it is possible to irradiate with the accuracy of less than 1 μm and precisely anneal the current injection area only. Between the electron gun 31 and the electrode holding the sapphire substrate is applied acceleration voltage of about 3 to about 30 kV, the diameter of the electron beam 34 radiated from the electron gun 31 is concentrated by the voltage applied to the electron concentration system 33 to become about 1 to about 100 μm on the surface of the wafer 36 which is a compound semiconductor layer laminated, the electron beam penetrates vertically to a depth of about 0.1 to about 1 μm with respect to the wafer 36 (the penetrat ion depth can be increased further by increasing the acceleration voltage), local temperature of the semiconductor layers rise to about 400 to about 800° C., the coupling of H with Mg or Zn is separated, so that H is released to start activation. Because the annealing by irradiation of this electron beam is conducted locally, only the current injection area is activated and provided with low resistance, so that it is possible to maintain the non-current injection area in high resistance state.

In accordance with the manufacturing method of the semiconductor laser of the embodiment 4, because it is possible to control precisely the current injection area by simply providing a protective film in the specified range and by heat treating under the atmosphere where H exists, or by simply annealing by irradiating electron beam to the specified range, it is possible to obtain a semiconductor laser of stripe structure which is precisely divided in the current injection area and the non-current injection area through a simple process. As a result, it is possible to obtain at reduced price a semiconductor laser with less leakage current and high light emitting efficiency.

Embodiment 5

Figure 11:
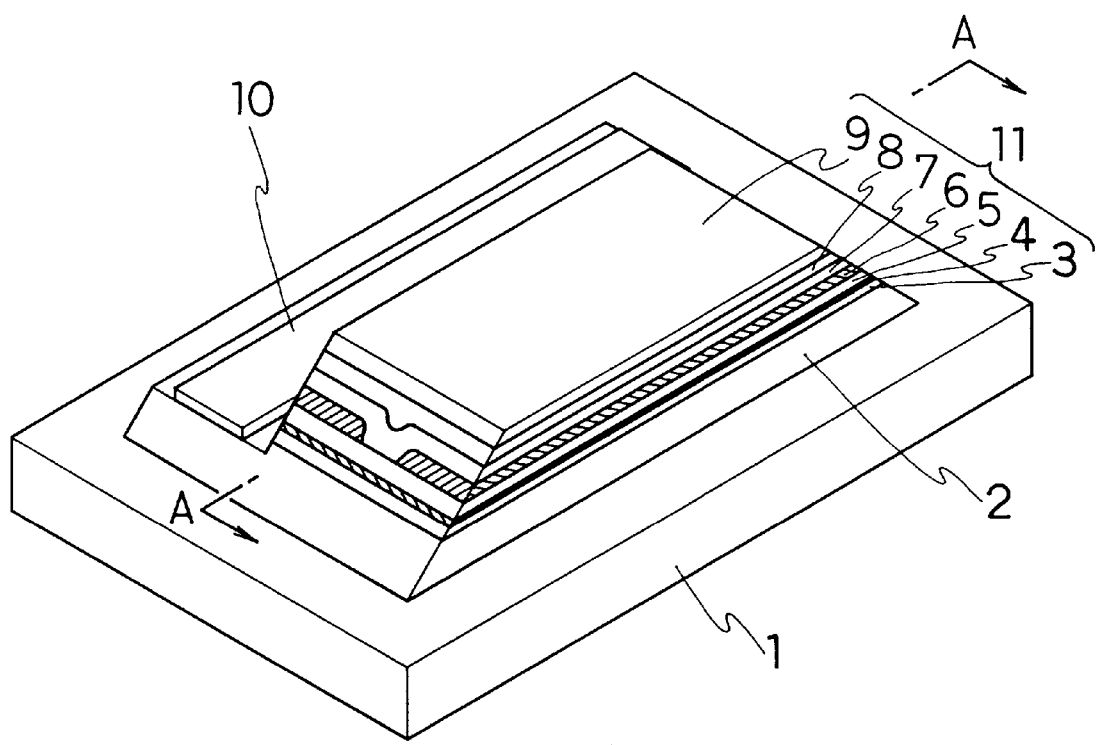
FIG. 11 is a schematic drawing showing an example of the semiconductor light emitting device of an embodiment 5.
Figure 12:
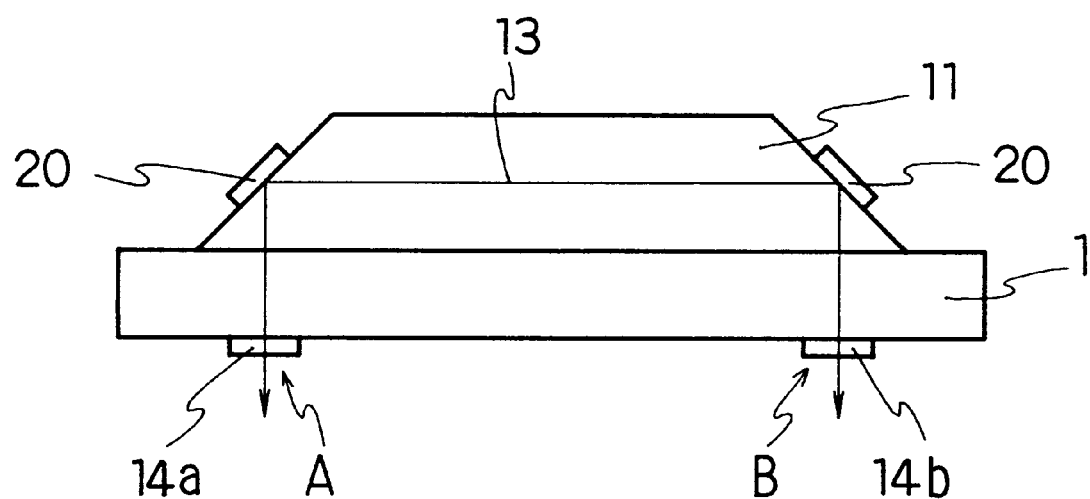
FIG. 12 is an explanatory drawing showing an example in a section along the line A—A of FIG. 11.
Figure 13:
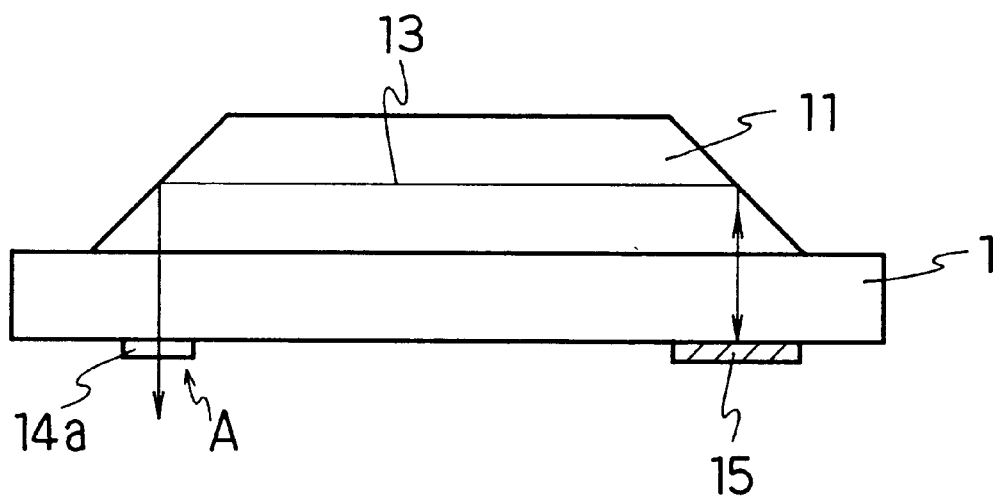
FIG. 13 is an explanatory drawing of other example in a section along the line A—A of FIG. 11.
Figure 14:
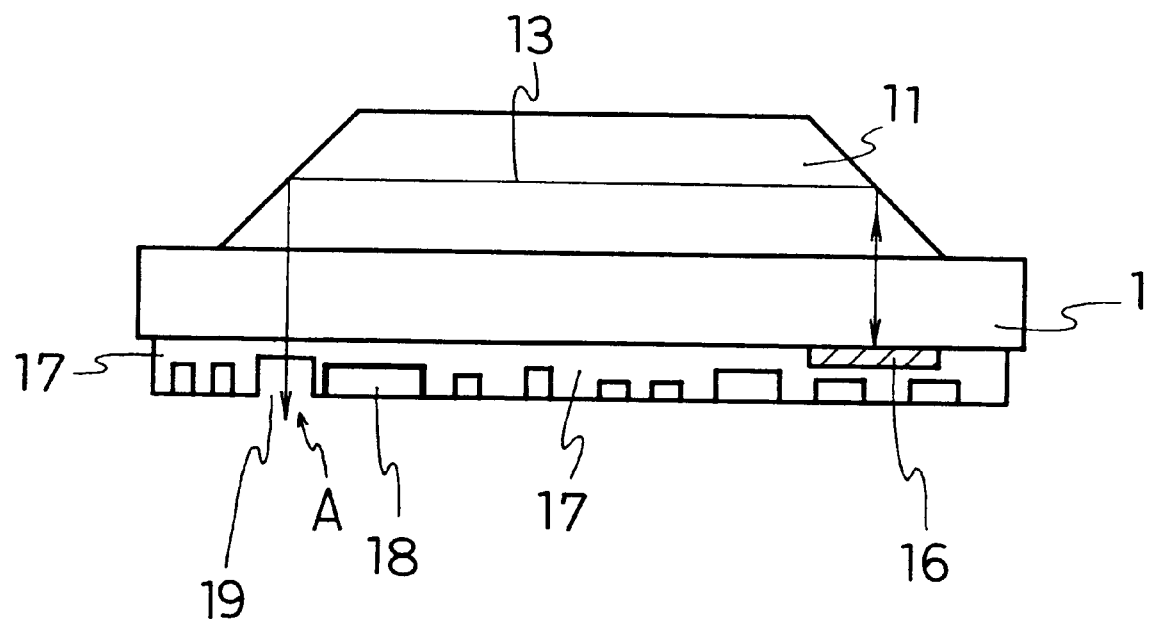
FIG. 14 is an explanatory drawing of further other example in a section along the line A—A of FIG. 11.

FIG. 11 is a drawing illustrating the external appearance of the semiconductor laser of an embodiment of the semiconductor light emitting device of the embodiment 5, FIG. 12 through FIG. 14 are the explanatory drawings showing the section along the line A—A and indicate respectively different concrete examples. In FIG. 11 through FIG. 14, the same symbols are used for the portions corresponding to those shown in FIG. 1 of the embodiment 1.

As shown in FIG. 11, in the semiconductor laser of the embodiment 5, there are laminated in order on a substrate 1 consisting of sapphire (single crystal of $Al_2O_3$) or the like, a buffer layer 2 comprising a low temperature buffer layer of about 0.01 to about 0.2 $\mu$m and a high temperature buffer layer of about 2 to about 5 $\mu$m consisting of an n-type $Al_eGa_fIn_{1-e-f}N$ ($0 \leq e<1$, $0<f \leq 1$, $0<e+f \leq 1$) or the like, a lower cladding layer 3 of about 0.1 to about 0.3 $\mu$m consisting of an n-type $Al_gGa_hIn_{1-g-h}N$ ($0 \leq e<g<1$, $0<h<1$, $0<g+h \leq 1$), an active layer 4 of about 0.05 to about 0.1 $\mu$m consisting of a non-doping type or n-type or p-type $Al_jGa_kIn_{1-j-k}N$ ($0<j<g$, $0<j+k<g+h$) and having a small band gap energy and a large refractive index than those of the lower cladding layer 3, a p-type first upper cladding layer 5 of about 0.1 to about 0.3 $\mu$m having the same composition as that of the lower cladding layer 3, a current blocking layer 6 consisting of an n-type GaN or the like and formed with the stripe groove, a p-type second upper cladding layer 7 of about 0.5 to about 2 $\mu$m having the same composition as that of the first cladding layer 5, and a contact layer 8 consisting of a p-type $Al_eGa_fIn_{1-e-f}N$ ($0 \leq e<1$, $0<f \leq 1$, $0<e+f \leq 1$) of about 0.3 to about 2 $\mu$m having the same composition as that of the buffer layer 2. And on the surface of the contact layer 8 is provided with an upper electrode 9, on the lower cladding layer or the buffer layer 2 exposed by etching part of the laminated semiconductor layers is provided with a lower electrode 10, and a chip of the semiconductor laser of the embodiment 5 is formed.

In this semiconductor laser, the end face where the active layer 4 is exposed is an inclined plane which forms 45° with respect to the surface of the substrate, that is, the surface of the laminated semiconductor layers, the laser beam caused to generate in the active layer 4 is reflected downward by that end face, so that the laser beam is introduced into the transparent substrate 1. In other words, because the refractive index of the semiconductor is 2.2 and the refractive index of air is 1, the beam generated in the active layer 4 and directed toward the end face is reflected totally on the inclined surface and then reflected downward. In this case, because there is also a light among the light going toward the end face which is not parallel with the substrate surface, it is preferable that a reflection film 20 (refer to FIG. 12) consisting of $Al_2O_3$, $SiO_2$ or the like is provided on the surface of the inclined plane, so that the light is reflected completely without the leak of the light. In addition, this inclined plane may not be a 45° inclined plane which forms an acute angle with respect to the surface of the substrate 1 on the side of the semiconductor layers as shown in FIG. 11 through FIG. 14 but may be a 45° inclined plane which reflects the light toward the opposite side of the substrate 1 on an inclined plane forming an obtuse angle 135° on the side of the semiconductor layers side.

In order to turn the end face of the semiconductor lamination 11 consisting of the foregoing laminated semiconductor layers into an inclined plane which forms 45° with respect to the surface of the semiconductor lamination 11, it is possible to obtain such inclined plane by installing the substrate deposited with the semiconductor lamination 11 inclined at 45°, and then conducting the reactive ion etching under the chlorine atmosphere. In this case, when an inclined plane is to be provided on both the end faces, it is necessary to change the direction of inclination of the substrate 1, and to perform twice the reactive ion etching.

Now, in addition to the semiconductor of gallium nitride type compound, the semiconductor light emitting device may be composed mainly of GaAs, so that it generates infrared ray or red light by using AlGaAs type semiconductor for the upper and lower cladding layers and the active layer. In this case, it is preferable that the substrate 1 is one that is transparent for respective light color emitted.

Further, a semiconductor laser is described in this embodiment, but with regard to an LED which has a double hetero junction structure wherein the active layer is interposed between cladding layers, and emits light from the end face, it is possible to form an LED which emits light from the substrate side or the opposite side thereof by reflecting the light completely on the end face in the same manner.

A concrete example will be described in detail concerning a semiconductor laser which is an example of the semiconductor light emitting device and which is provided with the variation on the reverse side of a transparent substrate 1. In either of FIG. 12 through FIG. 14, there are indicated only the transparent substrate 1 and a semiconductor lamination 11 which constructs a semiconductor laser and a laser beam path 13 formed therein.

An example shown in FIG. 12 is one in which multi-layer coating films 14a and 14b consisting of a dielectric are provided on the irradiating locations A and B of the reverse side of the substrate 1. A multi-layer coating film, for example, is formed by alternately providing two layers or more layers of an $SiO_2$ film and an amorphous silicon ($\alpha$—Si) film respectively to a thickness of $\lambda/4$ of the wave length $\lambda$ of the emitted light, and by making the thickness a little different from that of $\lambda/4$ or changing the number of the layers in the range of 2 to 10 layers or changing $SiO_2$ to $TiO_2$, $Al_2O_3$ or the like as the material of the dielectric film, it is possible to adjust the reflective index in the range of 10 to 90%. Of irradiating locations of A and B, it is enough for the semiconductor laser that the light is outputted practically from one side only, and when the laser beam from the irradiating location A is used as an output for example, the reflective index of the irradiating location A is lowered to 10 to 30% and the reflective index of the irradiating location B is increased to 70 to 90% to reflect most light, so that it is possible to monitor the intensity of the laser beam by the partly leaked light.

In FIG. 12, the numeral 20 indicates a reflection film which consists of $Al_2O_3$, $SiO_2$ or the like and is provided to facilitate the total reflection on the inclined plane of the active layer 4.

An example shown in FIG. 13 is one wherein a metallic film 15, in place of a dielectric multi-layer coating film, is provided on the irradiating location B of one side so as to cause total reflection. By providing a structure such as this, one of the walls of both ends of resonator will have been reflected completely, and all the light to be irradiated will be outputted from the irradiating location A and thus a large output is available. In the irradiating location A is provided with a dielectric multi-layer coating film 14a as in the case of the example shown in FIG. 12, and the reflective index is adjusted so that part of the light is reflected to oscillate sufficiently in the resonator. Further, in this embodiment, it is possible to provide the photodetector (photo sensor) for monitoring which monitors the output in the neighborhood of the irradiating location A, and to monitor the output by detecting the light leaking from the irradiating location A.

Figure 15:
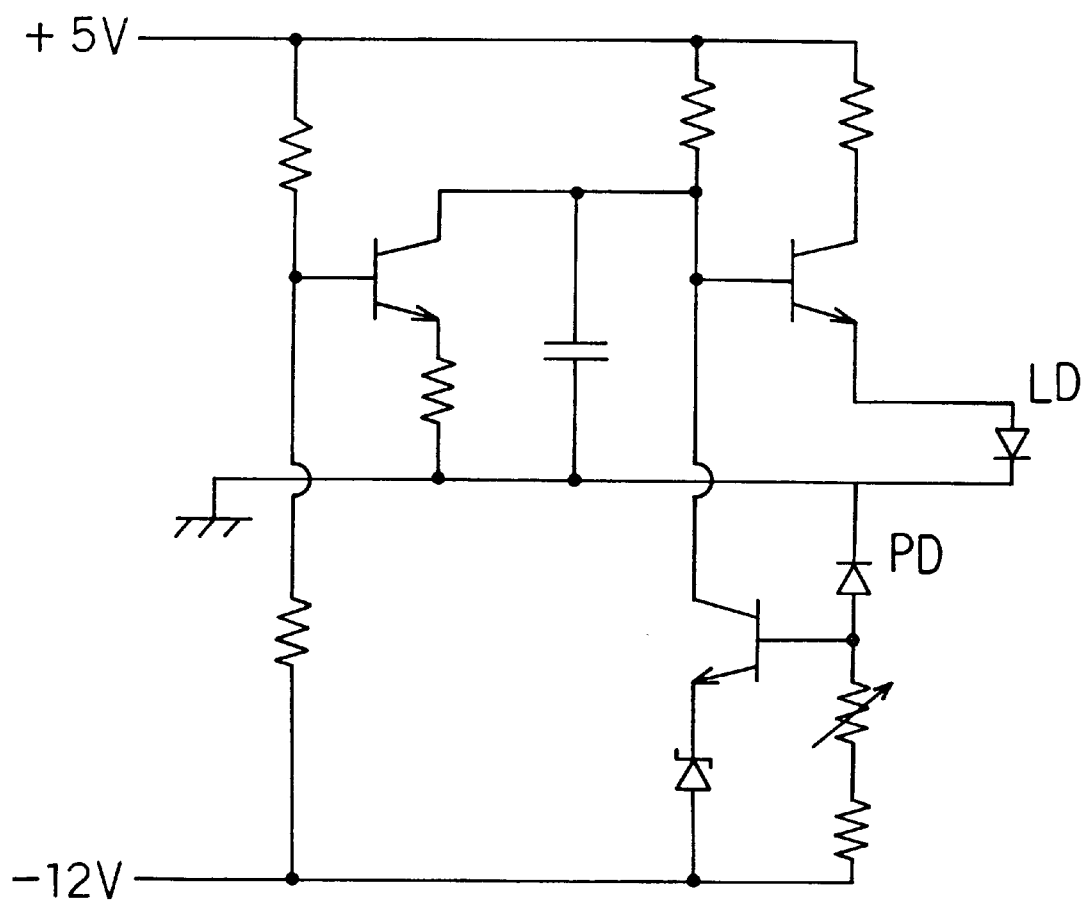
FIG. 15 is a circuit diagram of an example of the power control circuit.
Figure 16:
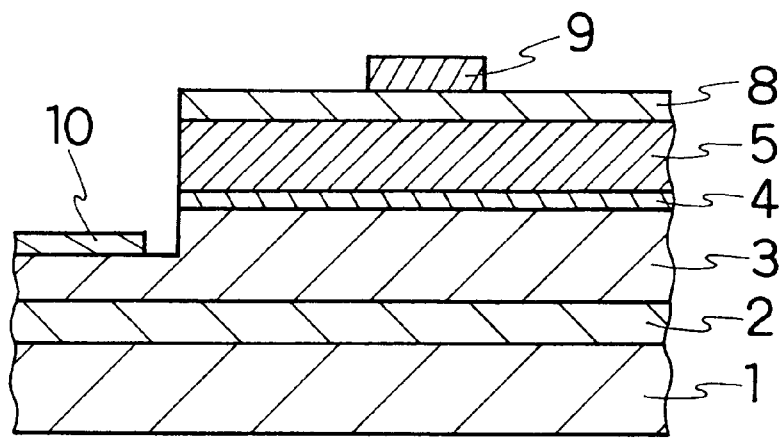
FIG. 16 is an explanatory drawing showing a semiconductor laser that can be considered by using a material of semiconductor of GaN type compound.
Figure 17:
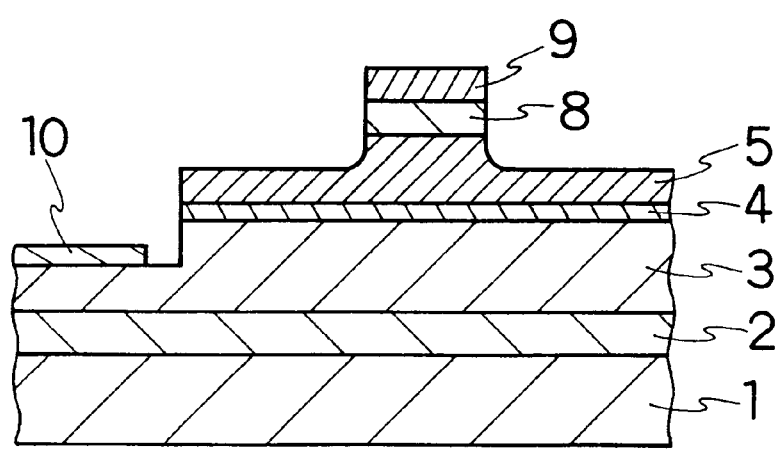
FIG. 17 is an explanatory drawing showing other semiconductor laser that can be considered by using a GaN type compound semiconductor material.
Figure 18:
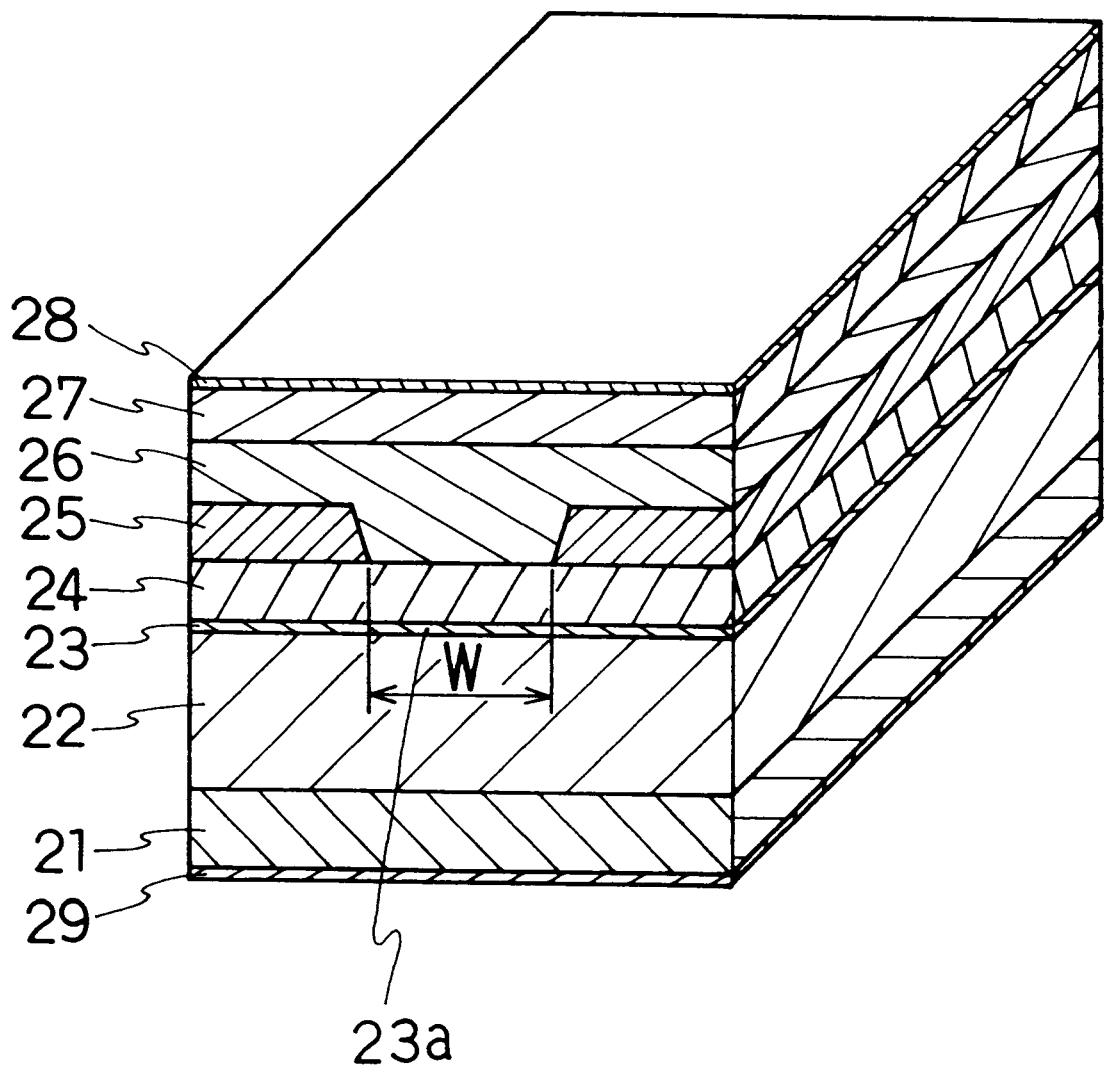
FIG. 18 is a perspective explanatory drawing showing a semiconductor laser which comprises a conventional GaAs type compound semiconductor material.
Figure 19:
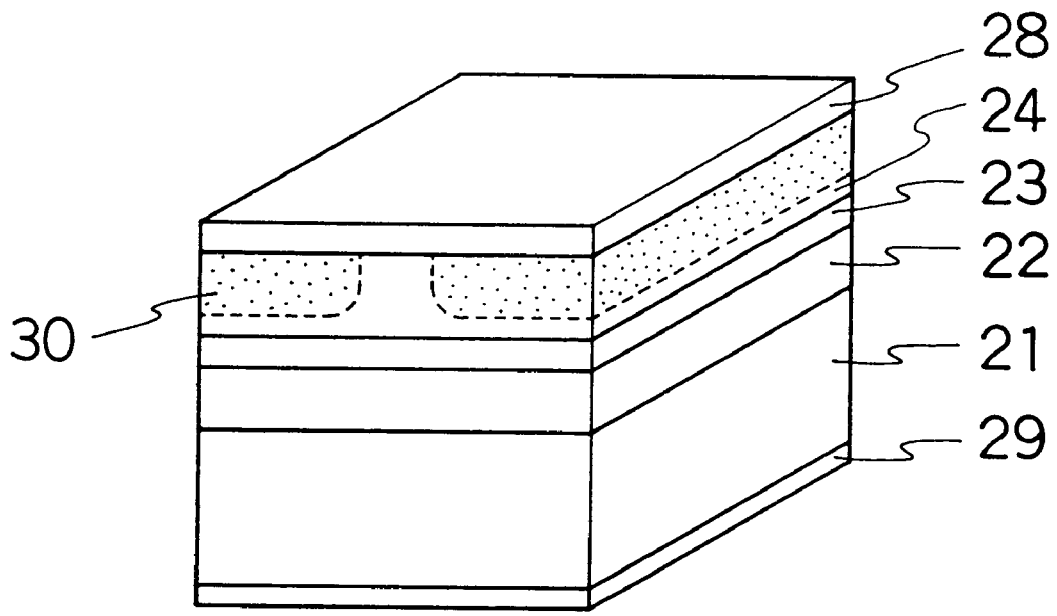
FIG. 19 is an explanatory drawing of a section showing other example of a structure in which the current injection area is controlled on a conventional semiconductor laser.
Figure 20:
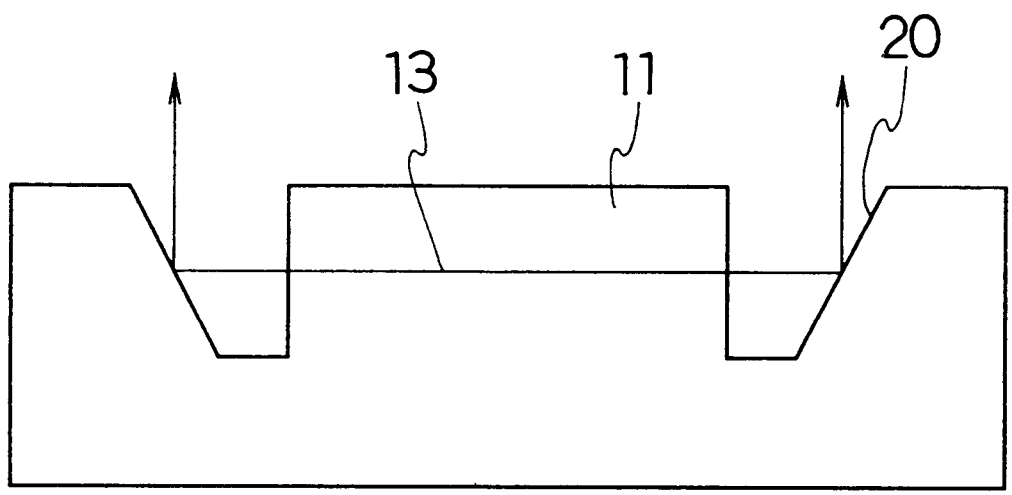
FIG. 20 is a drawing showing an external appearance of a semiconductor laser in which the conventional light path is bent 90°.

An example shown in FIG. 14 is characterized in that a semiconductor circuit element is provided on the reverse side of the substrate 1. In the example shown in FIG. 14, on the reverse side of the substrate 1 is formed a polycrystalline film such as Si or GaAs or amorphous silicon (α—Si) film so as to form a simple logic operation circuit of a power controller as shown in FIG. 15 for example, making it possible to control the output of the semiconductor laser. In this case, in order to monitor the output of the laser beam, it is possible to form a pn junction and form the photodetector 16 for monitoring into a semiconductor layer. Further, in FIG. 14, the numeral 17 represents a region forming elements consisting of semiconductor layer and the numeral 18 represents a detecting portion of the light reflected by the reverse side of the substrate 1 and is used for monitoring the power on the irradiating location. The numeral 19 represents an output window in which part of the semiconductor layer is etched and removed.

In FIG. 15, LD represents a laser diode consisting of a semiconductor lamination 11 (refer to FIG. 14) and PD represents a photodetector 16 (refer to FIG. 14), for example photodiode, for monitoring. The electric power applied to the LD is adjusted by the electric current of the photodetector 16 for monitoring.

In an example shown in FIG. 14, it is possible to adjust the reflective index at the irradiating location A by the semiconductor layer formed on the reverse side of the substrate 1, but the adjustment of the reflective index at the irradiating location may be performed by the example shown in FIG. 12 or FIG. 13, and the semiconductor chip formed with a semiconductor circuit may be bonded to the reverse side of the substrate 1.

Further, as the pn junction for monitoring, if the wave length is less than 800 nm, it is possible to receive the light even by a semiconductor material consisting of GaAs.

In further other example, which is not shown in the drawing, an optical element such as a hologram or a convex lens is provided in the part of the output window 19 of FIG. 14, and because the optical element can be installed directly on the reverse side of the substrate 1, so that it is easy to adjust the alignment of optical axis of the optical element and the laser beam to install and to assemble a semiconductor laser into the set. When a hologram is provided, it is possible to focus the light directly into an optical disk, and when a convex lens is provided, it is possible to obtain a semiconductor laser which is capable of focusing the light into an optical fiber as a unit for optical communication.

In each example of this embodiment 5, all the laser beam is taken out finally from the reverse side of the substrate, but the light may be taken out from the side or the upper surface of the substrate by converting the direction of light by incorporating a reflector or the like in the transparent substrate 1. In addition, because installation of an optical element such as prism or lens on the reverse side of the substrate is far easy as compared with that on the end face on the semiconductor laser, it is possible to change easily the direction of the light at that position.

Because the semiconductor light emitting element in the embodiment 5 utilizes total reflection due to the difference of the refractive index with the end face being used as an inclined plane, there is less leakage of light, the adjustment of the reflective index on the reverse side of the substrate is not conducted on the laminated semiconductor lays, so a metallic film can also be used, thereby improving the light emitting efficiency. Further, because no deterioration occurs on the end face of the semiconductor layer, durability is improved. Also, because the adjustment of the length of resonator is easy, it is possible to design freely the size of the chip which is the length of the active layer according to the necessary output of light.

Further, the intensity of the irradiated beam is freely adjusted by using the monitor circuit provided on a substrate for the semiconductor light emitting device, and integration with a component such as the monitor circuit is possible so as to increase overall integration density, so that it is possible to give the semiconductor light emitting device such as a user-friendly semiconductor laser.

In the foregoing embodiments 1 through 4, as a semiconductor of gallium nitride type compound, it was described by way of an example of a laminated layer of GaN and $Al_xGa_{1-x}N$ and $Ga_yIn_{1-y}N$, but as a semiconductor layer, it is not limited to the material of the foregoing composition and there can be generally employed such a material composed of a general expression $Al_pGa_qIn_{1-p-q}N$ ($0 \leq p<1$, $0<q \leq 1$, $0<p+q \leq 1$), by selecting p and q which is the amount of composition ratio, and may be selected so that the active layer has small band gap energy and large refractive index than those of the cladding layer. Further, the present invention can be applied in the same manner to a material in which part or whole of N of the foregoing $Al_pGa_qIn_{1-p-q}N$ is replaced by As and/or P.

Though several embodiments of the present invention are described above, it is to be understood that the present invention is not limited only to the above-mentioned, various changes and modifications may be made in the invention without departing from the sprit and scope thereof.

What is claimed is:

1. A semiconductor laser comprising:
    an active layer comprising a semiconductor of gallium nitride type compound;
    cladding layers comprising an upper cladding layer and a lower cladding layer sandwiching said active layer, said cladding layers comprising a semiconductor of gallium nitride type compound having a band gap energy larger than that of said active layer; and
    a current blocking layer being provided in at least one of said cladding layers, said current blocking layer being provided with a stripe groove;
    wherein said current blocking layer is made of a material that absorbs light generated in said active layer, and different from said semiconductor of gallium nitride type compound.

2. The semiconductor laser according to claim 1, wherein said active layer comprises a semiconductor of $In_xGa_{1-x}N$ ($0<x<1$), and each of said cladding layers comprises $Al_zGa_{1-z}N$ ($0<z<1$).

3. The semiconductor laser according to claim 1, wherein said current blocking layer is a layer having a conductive type opposite to a cladding layer in which said current blocking layer is provided in or having large electric resistivity.

4. The semiconductor laser according to claim 1, wherein said current blocking layer comprises at least one kind of a semiconductor of a compound selected from a group consisting of GaAs, GaP, InP, and AlGaAs type compound and AlGaP type compound.

5. The semiconductor laser according to claim 1, wherein said current blocking layer comprises Si or Ge.

* * * * *